(12) United States Patent
Ogawa et al.

(10) Patent No.: US 7,820,509 B2
(45) Date of Patent: Oct. 26, 2010

(54) SEMICONDUCTOR DEVICE AND METHOD OF MANUFACTURING THE SAME

(75) Inventors: Hiroyuki Ogawa, Kanagawa (JP); Hideyuki Kojima, Kanagawa (JP); Taiji Ema, Kanagawa (JP)

(73) Assignee: Fujitsu Semiconductor Limited, Yokohama (JP)

( * ) Notice: Subject to any disclaimer, the term of this patent is extended or adjusted under 35 U.S.C. 154(b) by 27 days.

(21) Appl. No.: 11/785,793

(22) Filed: Apr. 20, 2007

(65) Prior Publication Data
US 2008/0054362 A1 Mar. 6, 2008

(30) Foreign Application Priority Data
Aug. 31, 2006 (JP) ............................. 2006-235683

(51) Int. Cl.
*H01L 29/94* (2006.01)
*H01L 21/336* (2006.01)

(52) U.S. Cl. ...................... 438/257; 257/365

(58) Field of Classification Search ............... 257/314, 257/239, 213, 261, 288, E27.081, E21.409; 438/257
See application file for complete search history.

(56) References Cited
U.S. PATENT DOCUMENTS

| | | | | |
|---|---|---|---|---|
| 4,185,319 A * | 1/1980 | Stewart | ............... | 365/185.01 |
| 5,400,278 A * | 3/1995 | Kunori et al. | ............... | 365/182 |
| 5,789,293 A * | 8/1998 | Cho et al. | ............... | 438/257 |
| 6,458,655 B1 * | 10/2002 | Yuzuriha et al. | ............ | 438/257 |
| 6,489,650 B2 * | 12/2002 | Kumazaki | ............... | 257/318 |
| 6,512,253 B2 * | 1/2003 | Watanabe et al. | ........... | 257/208 |
| 7,235,476 B2 * | 6/2007 | Nakagawa | ................ | 438/622 |
| 2002/0154556 A1 * | 10/2002 | Endoh et al. | ............... | 365/200 |
| 2006/0246659 A1 | 11/2006 | Jeong | | |

FOREIGN PATENT DOCUMENTS
JP 10-209390 A 8/1998
KR 10-0603694 7/2006

OTHER PUBLICATIONS
"Chinese Office Action", English translation, sent Jan. 16, 2009 in corresponding Chinese Patent App. No. 200710103912.1.

* cited by examiner

*Primary Examiner*—Leonardo Andújar
*Assistant Examiner*—Jordon Klein
(74) *Attorney, Agent, or Firm*—Fujitsu Patent Center

(57) ABSTRACT

The method of manufacturing a semiconductor device, including a first region where a transistor including a gate electrode of a stacked structure is formed, a second region where a transistor including a gate electrode of a single-layer structure is formed, and a third region positioned in a boundary part between the first region and the second region, includes: depositing a first conductive film, patterning the first conductive film in the first region and the third region so that the outer edge is positioned in the third region, depositing the second conductive film, patterning the second conductive film to form a control gate in the first region while leaving the second conductive film, covering the second region and having the inner edge positioned inner of the outer edge of the first conductive film, and patterning the second conductive film in the second region to form the gate electrode.

4 Claims, 23 Drawing Sheets

SEMICONDUCTOR DEVICE AND METHOD OF MANUFACTURING THE SAME

CROSS-REFERENCE TO RELATED APPLICATIONS

This application is based upon and claims the benefit of priority from the prior Japanese Patent Application No. 2006-235683, filed on Aug. 31, 2006, the entire contents of which are incorporated herein by reference.

BACKGROUND OF THE INVENTION

The present invention relates to a semiconductor device and a method of manufacturing the same, more specifically, a semiconductor device comprising a nonvolatile memory of the stacked gate structure and a transistor of the single-layer gate structure, and a method of manufacturing the semiconductor device.

The logic semiconductor device combined with a nonvolatile semiconductor memory forms product fields, as of CPLD (Complex Programmable Logic Device) and FPGA (Field Programmable Gate Array), and because of their characteristic of programmability, so far have formed large markets because of their characteristic, programmability.

The logic semiconductor device combined with a nonvolatile memory has, in addition to flash memory cells, a high-voltage transistors for controlling the flash memory and low-voltage transistors of high-performance logic circuit integrated on the same semiconductor chip. The flash memory cells have gate electrode of the stacked structure of a floating gate and a control gate laid one on the other which is different from the single-layer structure of the high-voltage transistors and the low-voltage transistors. Accordingly, the process of manufacturing the logic semiconductor device combined with the nonvolatile memory requires the process specialized in forming the nonvolatile memory transistors of the stacked gate structure without changing characteristics of the peripheral circuits, especially the logic transistors.

In the usual combined process, the floating gates of the nonvolatile memory transistors are formed of the first-level conductive film (the first conductive film), and the control gates of the nonvolatile memory transistors and the gate electrodes of the peripheral transistors are formed of the second-level conductive film (the second conductive film). Then, the peripheral transistors are formed after the nonvolatile memory transistors have been formed, so as to prevent the process of manufacturing the nonvolatile memory transistors from influencing characteristics of the logic transistors. In terms of the process of forming the gate electrodes, after the second conductive film in the memory cell region have been patterned to form the control gates, the second conductive film in the peripheral circuit region is patterned to form the gate electrodes of the peripheral transistors.

The related arts are described in, e.g., Reference 1 (Japanese published unexamined patent application No. Hei 10-209390).

However, the inventors of the present application have examined the process of fabricating the logic semiconductor device combined with the nonvolatile memory and found that the process causes the disadvantage that the second conductive film in the memory cell region is etched when the second conductive film is patterned to form the gate electrodes of the peripheral transistors.

SUMMARY OF THE INVENTION

An object of the present invention is to provide a structure suitable for the semiconductor device combined with non-volatile memory transistors gate electrodes of the stacked structure and peripheral transistors having gate electrodes of the single-layer structure, and a method of manufacturing the semiconductor device.

According to one aspect of the present invention, there is provided a method of manufacturing a semiconductor device including on a semiconductor substrate a first region where a first transistor including a first gate electrode of a stacked structure having a floating gate and a control gate is formed, a second region where a second transistor including a second gate electrode of a single-layer structure is formed, and a circular third region positioned in a boundary part between the first region and the second region, comprising the steps of: forming a first conductive film over the first region, the second region and the third region of the semiconductor substrate; removing the first conductive film in the second region while patterning the first conductive film in the first region and the third region so that an outer edge of the first conductive film is positioned in the third region; forming a first insulating film covering the first conductive film in the first region of the semiconductor substrate; forming a second conductive film over the first region, the second region and the third region of the semiconductor substrate; patterning the second conductive film to form the control gate of the second conductive film in the first region while leaving the second conductive film so that the second conductive film covers the second region and is positioned in the third region having an inner edge positioned inner of said outer edge; patterning the first insulating film and the first conductive film in the first region to form the floating gate of the first conductive film; and patterning the second conductive film in the second region to form the second gate electrode of the second conductive film in the second region.

According to another aspect of the present invention, there is provided a semiconductor device comprising on a semiconductor substrate a first region where a first transistor including a first gate electrode of a stacked gate structure having a floating gate of the first conductive film and a control gate of a second conductive film is formed, a second region positioned enclosing the first region, where a second transistor including a second gate electrode of a single-layer structure of the second conductive film is formed, and a circular third region positioned in a boundary part between the first region and the second region, a pattern of the first conductive film is formed in the third region.

According to further another aspect of the present invention, there is provided a semiconductor device comprising: a first transistor of a stacked gate structure including a floating gate of a first conductive film and a control gate of a second conductive film and formed in a first region of a semiconductor substrate; a second transistor of a single-layer gate structure formed in a second region of the semiconductor substrate; a device isolation insulating film formed in a third region of the semiconductor substrate; and a stacked body of the first conductive film and the second conductive film formed on the device isolation insulating film, the third region being positioned between the first region and the second region, and an opening begin formed in the stacked body through the second conductive film and the first conductive film reaching down to the device isolation insulating film.

According to the present invention, in a method of manufacturing a semiconductor device including on a semiconductor substrate a first region where a first transistor including a first gate electrode of a stacked structure having a floating gate and a control gate is formed, a second region where a second transistor including a second gate electrode of a single-layer structure is formed, and a circular third region positioned in a boundary part between the first region and the second region, a first conductive film is formed over the first region, the second region and the third region of the semiconductor substrate; the first conductive film in the second region is removed while patterning the first conductive film in the first region and the third region so that an outer edge of the first conductive film is positioned in the third region; a first insulating film covering the first conductive film is formed in the first region of the semiconductor substrate; a second conductive film is formed over the first region, the second region and the third region of the semiconductor substrate; the second conductive film is patterned to form the control gate of the second conductive film in the first region while leaving the second conductive film so that the second conductive film covers the second region and is positioned in the third region having an inner edge positioned inner of said outer edge; the first insulating film and the first conductive film in the first region is patterned to form the floating gate of the first conductive film; and the second conductive film in the second region is patterned to form the second gate electrode of the second conductive film in the second region, whereby in the step of patterning the first insulating film, the region where the device isolation insulating film at the edge of the first region is etched can be much decreased. Thus, the photoresist film for forming the second gate electrode is prevented flowing in a large amount into the trench of the device isolation insulating film. The photoresist film in the first region can be prevented from being thinned. When the second gate electrode is formed, the control gate is prevented from being etched.

DETAILED DESCRIPTION OF THE PREFERRED EMBODIMENTS

Reference Embodiment

The method of manufacturing the semiconductor device according to a reference embodiment of the present invention will be explained with reference to FIGS. 1A to 9.

Figure 8A:
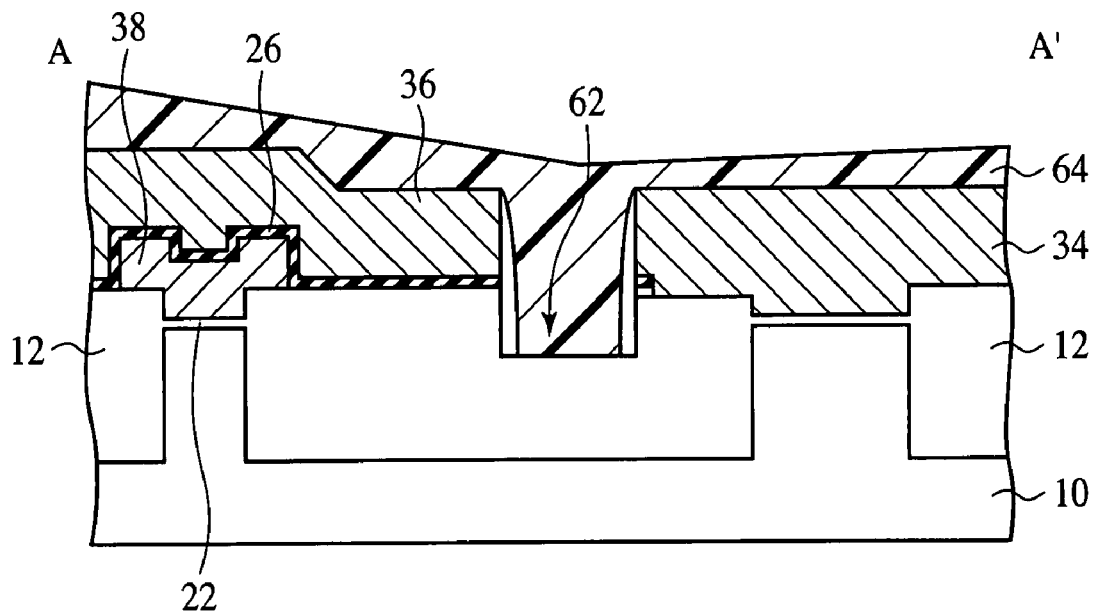
FIGS. 8A and 8B are views showing thinning of the photoresist film in the periphery of the memory cell region in the method of manufacturing the semiconductor device according to the reference embodiment of the present invention.
Figure 8B:
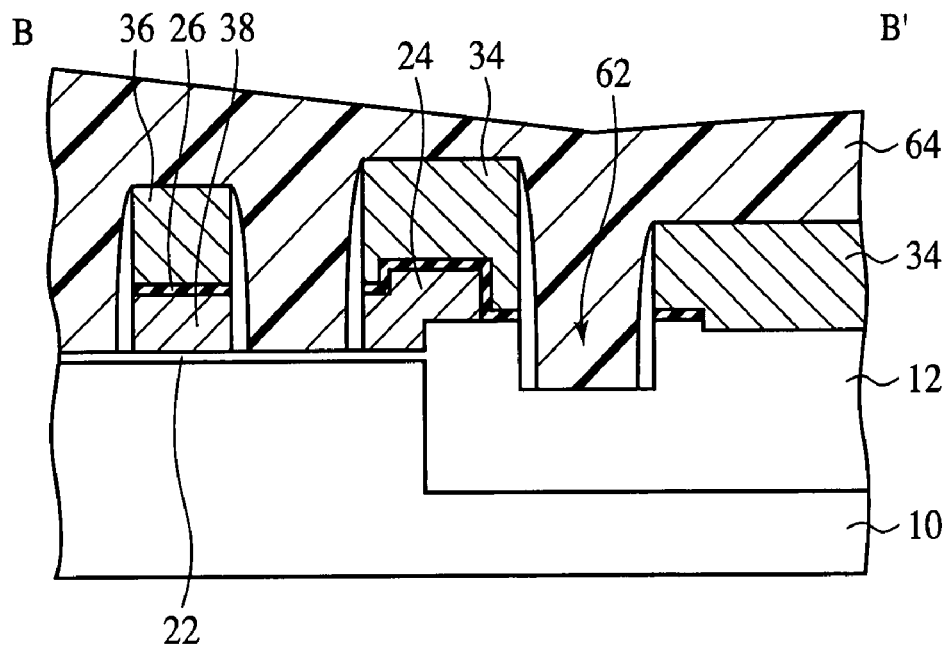
Figure 9:
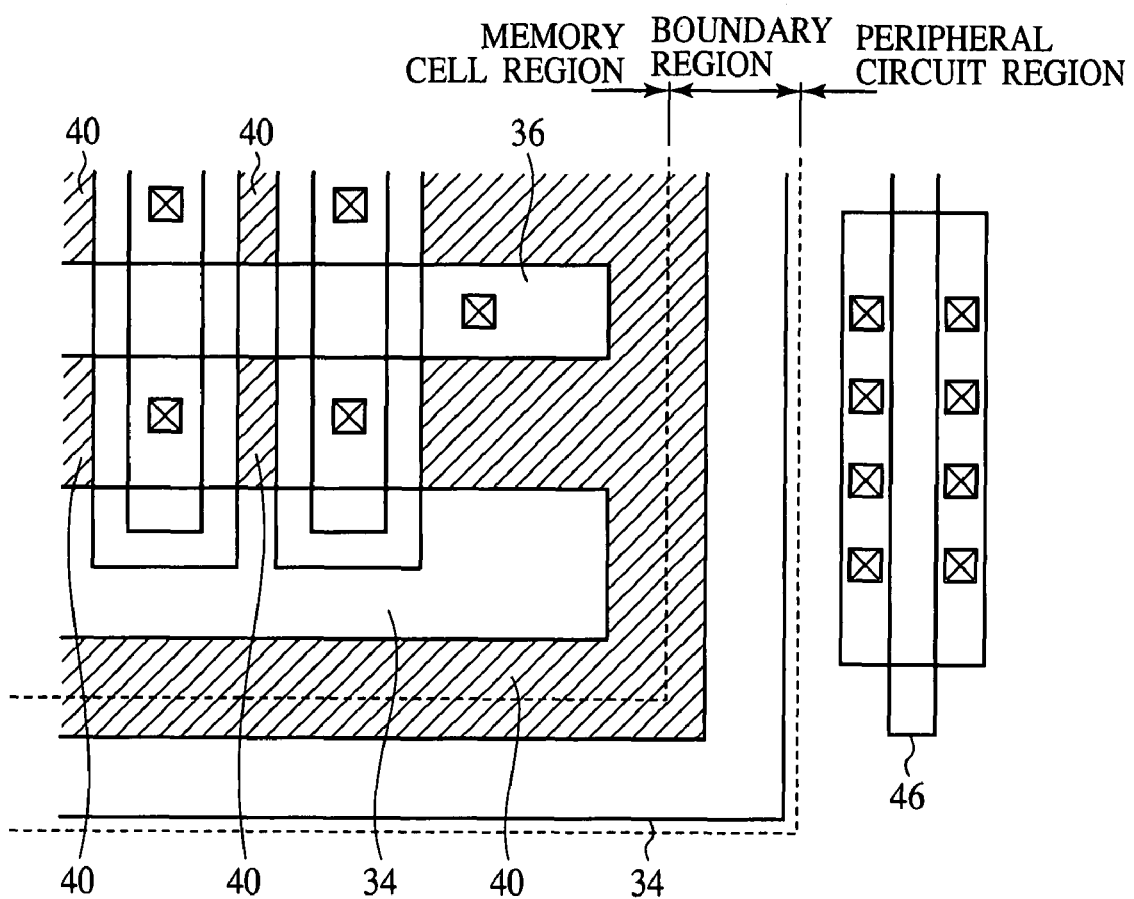
FIG. 9 is a plan view showing the recess region in the memory cell region of the semiconductor device according to the reference embodiment of the present invention.

FIGS. 1A to 7C are views showing the method of manufacturing the semiconductor device according to the present reference embodiment. FIGS. 8A and 8B are views showing thinning of the photoresist film in the periphery of the memory cell region. FIG. 9 is a plan view showing the recess region in the memory cell region.

In each of FIGS. 1 to 7, (A) is a plan view of the neighborhood of the boundary region between the memory cell region and the peripheral circuit region, (B) is the sectional view along the line A-A' in a step of the method of manufacturing the semiconductor device, and (C) is the sectional view along the line B-B' in a step of the method of manufacturing the semiconductor device.

In the present reference embodiment, the processing steps are mainly explained, and the impurity doping steps, etc., will be omitted.

First, in a silicon substrate 10, a device isolation insulating film 12 for defining device regions 14a and 14b are formed by, e.g., STI (Shallow Trench Isolation) method. Here, device regions 14a for nonvolatile memory transistors to be formed in are formed in a memory cell region, and device regions 14b for logic transistors to be formed in are formed in a peripheral circuit region.

Figure 1A:
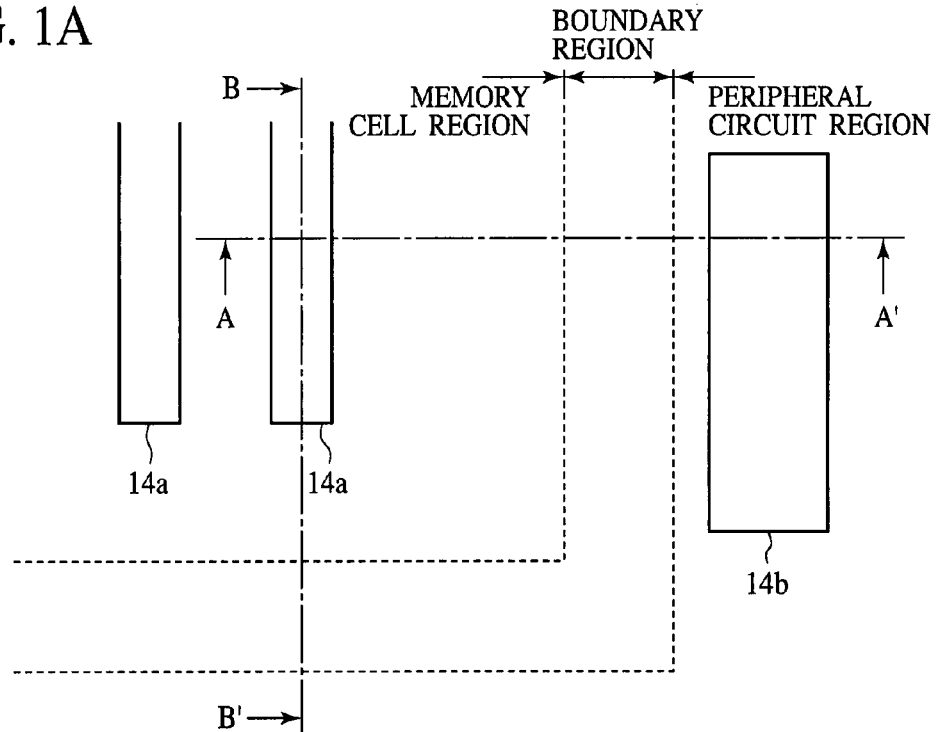
FIGS. 1A-1C, 2A-2C, 3A-3C, 4A-4C, 5A-5C, 6A-6C and 7A-7C are views showing the method of manufacturing the semiconductor device according to the reference embodiment of the present invention.
Figure 1B:
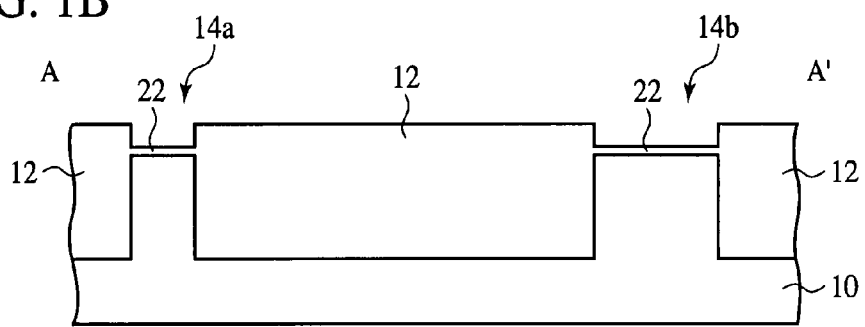
Figure 1C:
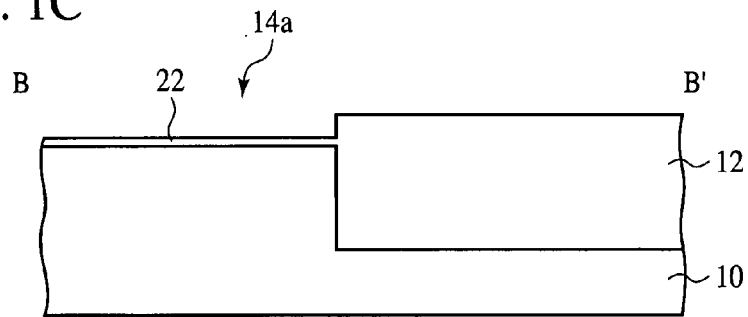

Next, the silicon substrate 10 is thermally oxidized by, e.g., thermal oxidation method to form a tunnel gate insulating film 22 of a silicon oxide film on the surface of the device regions 14a, 14b (FIGS. 1A, 1B and 1C).

Then, on the silicon substrate 10 with the tunnel gate insulating film 22 formed on, a polycrystalline silicon film 24 of, e.g., a 90 nm-thickness is deposited by, e.g., CVD method. The polycrystalline silicon film 24 is the conductive film to be floating gates.

Figure 2A:
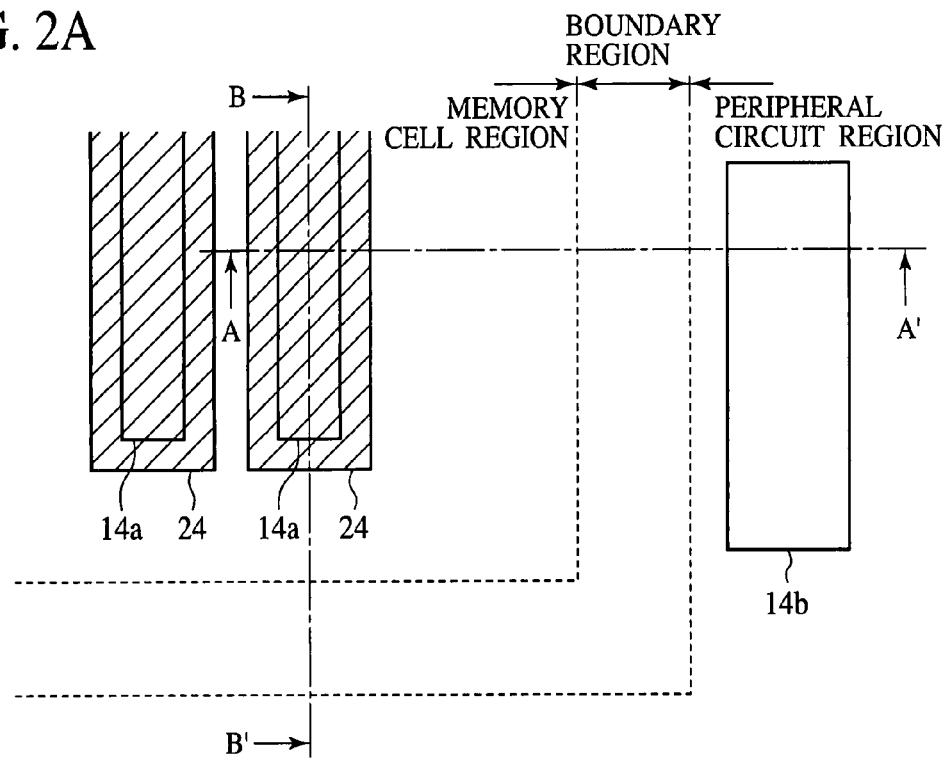

Then, the polycrystalline silicon film 24 is patterned by photolithography and dry etching. This patterning is made for the preparatory processing for isolating the floating gates of the memory cells neighboring in the extending direction of the word lines (horizontally in the drawing) and for removing the polycrystalline silicon film 24 in the peripheral circuit region. As shown in FIG. 2A, the patterned polycrystalline silicon film 24 is stripe-shaped patterns covering the device regions 14a and is not left in the boundary region and the peripheral circuit region.

Figure 2B:
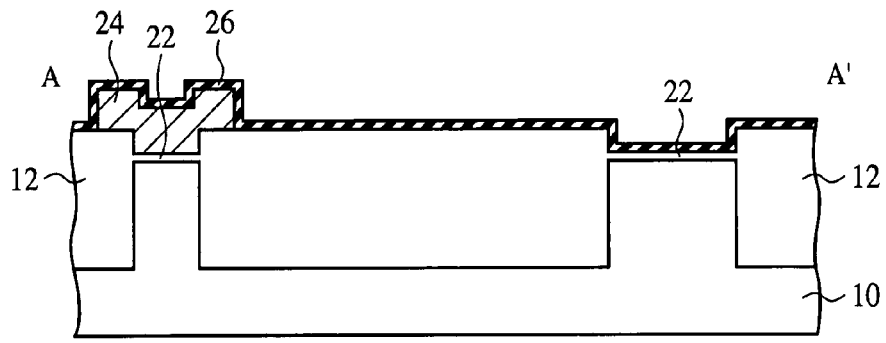
Figure 2C:
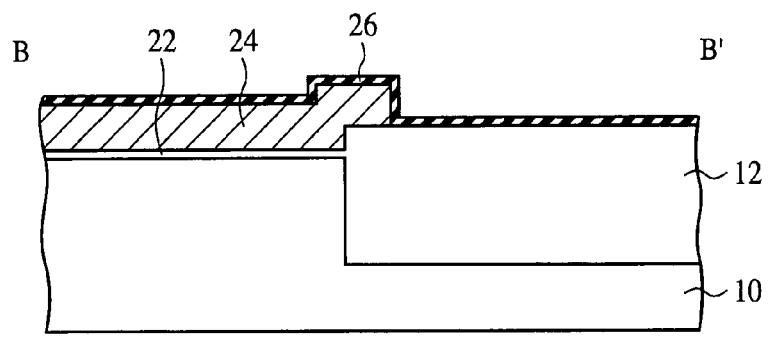

Next, a silicon oxide film and a silicon nitride film are deposited on the entire surface by, e.g., CVD method, and then silicon oxide film is grown by thermal oxidation to form an ONO film 26 of the silicon oxide film/silicon nitride film/silicon oxide film structure (FIGS. 2A, 2B and 2C). The ONO film 26 is formed of the bottom oxide film of, e.g., a 5 nm-thickness, the silicon nitride film of, e.g., a 5 nm-thickness and the top oxide film of, e.g., a 5 nm-thickness.

Figure 3A:
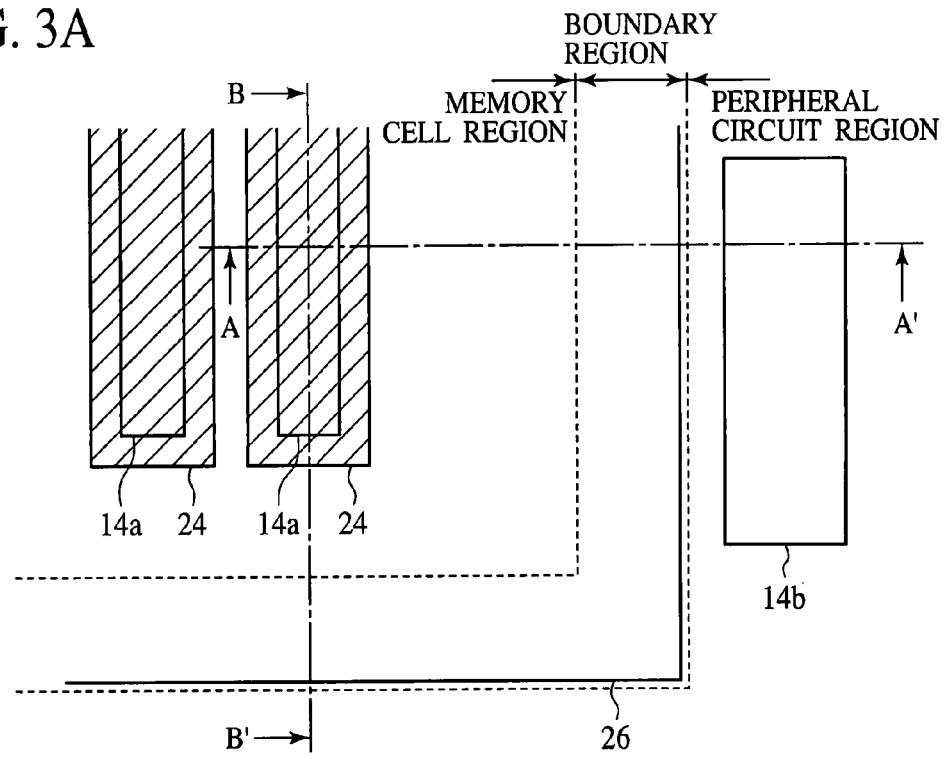
Figure 3B:
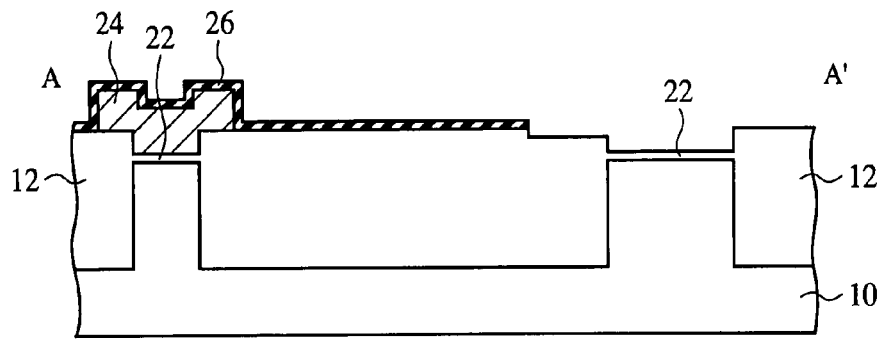
Figure 3C:
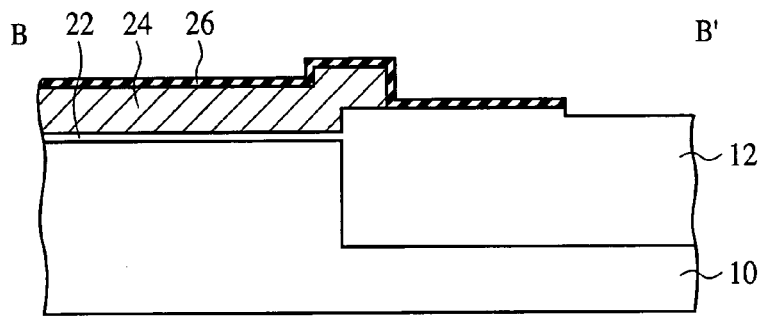

Then, the ONO film 26 in the peripheral circuit region is removed selectively by photolithography and dry etching (FIGS. 3A, 3B and 3C).

Next, the tunnel gate insulating film 22 formed on the device regions 14b in the peripheral circuit region is selectively removed by photolithography and wet etching.

Then, the silicon substrate 10 is thermally oxidized by, e.g., thermal oxidation method to form a gate insulating film 32 of a silicon oxide film on the device regions 14b in the peripheral circuit region.

Figure 4A:
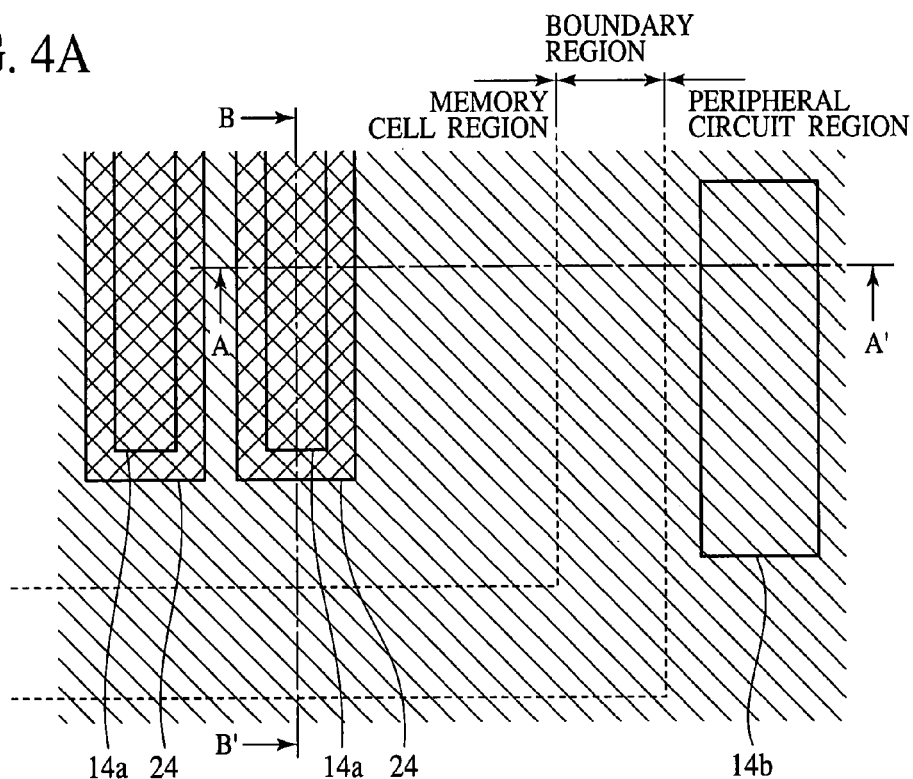
Figure 4B:
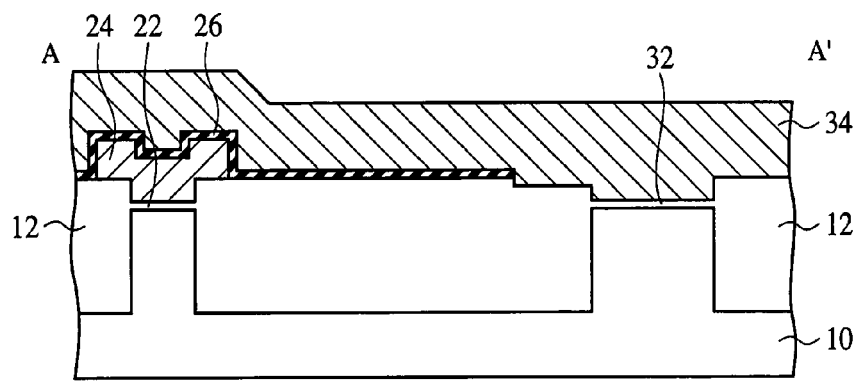
Figure 4C:
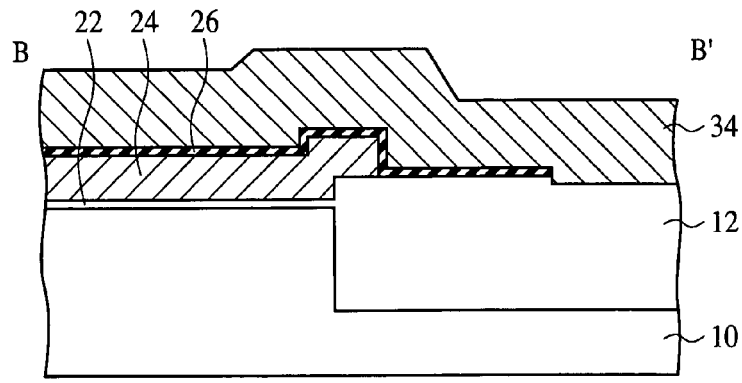

Next, a polycrystalline silicon film 34 is deposited on the entire surface by, e.g., CVD method (FIGS. 4A, 4B and 4C). The polycrystalline silicon film 34 is the conductive film to be the control gates of the nonvolatile memory transistors and the gate electrodes of the peripheral transistors.

Then, the polycrystalline silicon film 34 in the memory cell region is patterned by photolithography and dry etching to form word lines 36 which function as the control gates of the nonvolatile memory transistors. At this time, the polycrystalline silicon film 34 in the region covering the edges of the device regions 14a in the memory cell region, and in the peripheral circuit region is left. The inner edge of the polycrystalline silicon film covering the peripheral circuit region is positioned in the boundary region between the memory cell region and the peripheral circuit region (see FIG. 5A).

Next, the ONO film 26 and the polycrystalline silicon film 24 are patterned by using the photoresist film for patterning the polycrystalline silicon film 34 as a mask. Thus, the floating gates 38 formed of the polycrystalline silicon film are formed beneath the word lines 36.

The etching for the ONO film 26 must be over-etching sufficient to completely remove the ONO film 26 formed on the side walls of the polycrystalline silicon film 24. Accordingly, in the regions 40 where the polycrystalline silicon film 24 is not formed (recess regions 40), the device isolation insulating film 12 is etched when the ONO film 26 is etched, and recesses 62 are formed. Under the conditions described above, the depth of the recesses 62 formed in the device isolation insulating film 12 is about 70-90 nm.

Figure 5A:
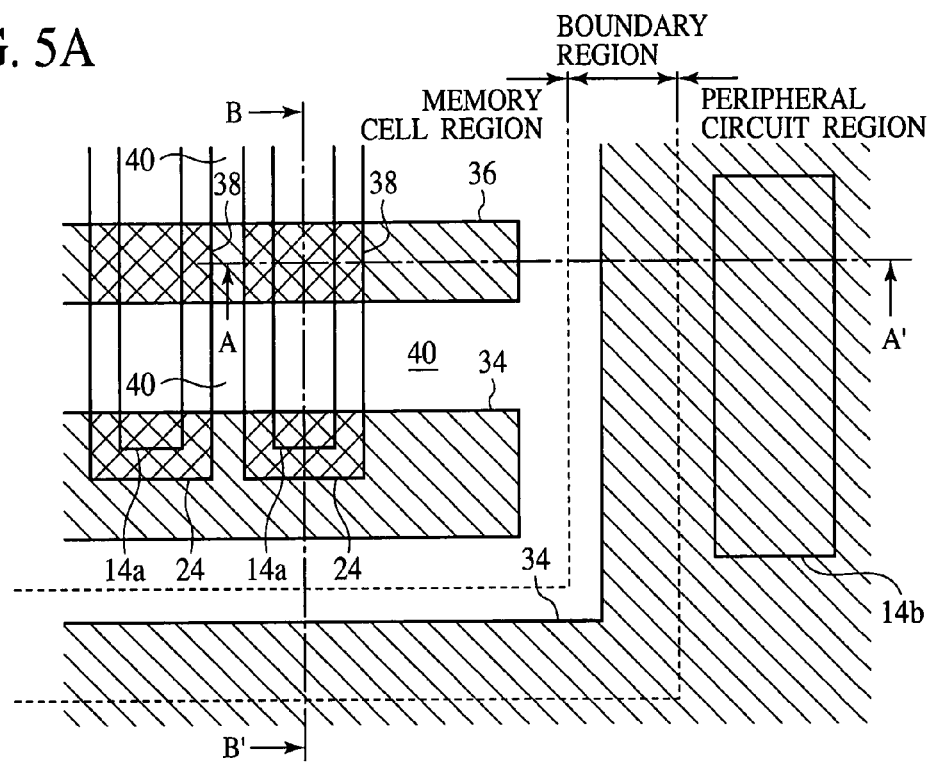
Figure 5B:
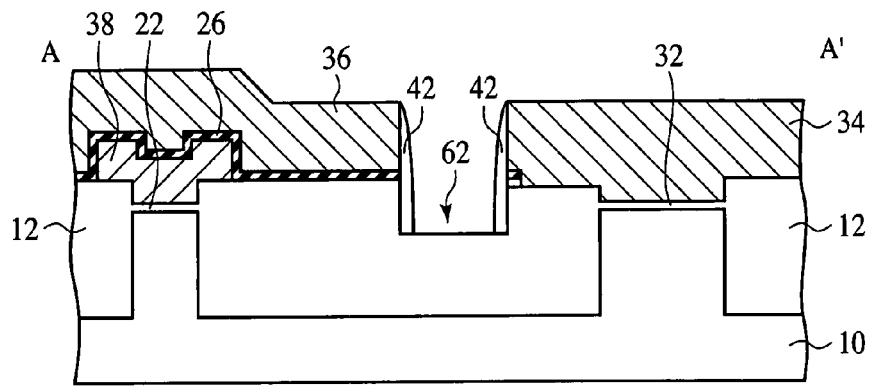
Figure 5C:
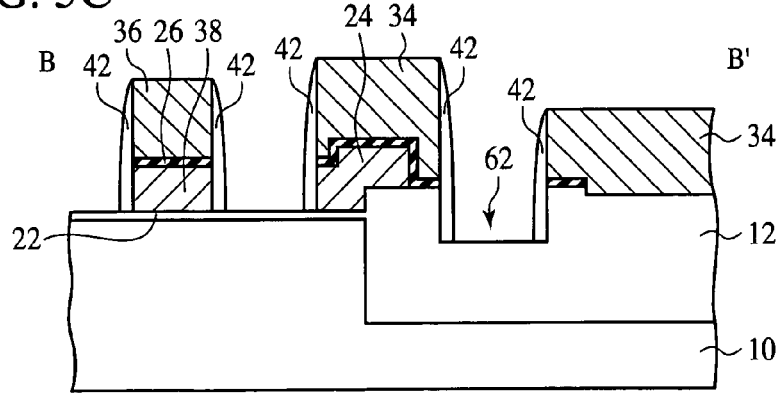

Next, a silicon nitride film is deposited on the entire surface by, e.g., CVD method and then etched back to form a sidewall insulating film 42 of the silicon nitride film on the side walls of the word lines 36, the floating gates 38, the polycrystalline silicon films 24, 34 (FIGS. 5A, 5B and 5C).

Then, the polycrystalline silicon film 34 in the peripheral circuit region is patterned by photolithography and dry etching to form the gate electrodes 46 of the peripheral transistors.

Figure 6A:
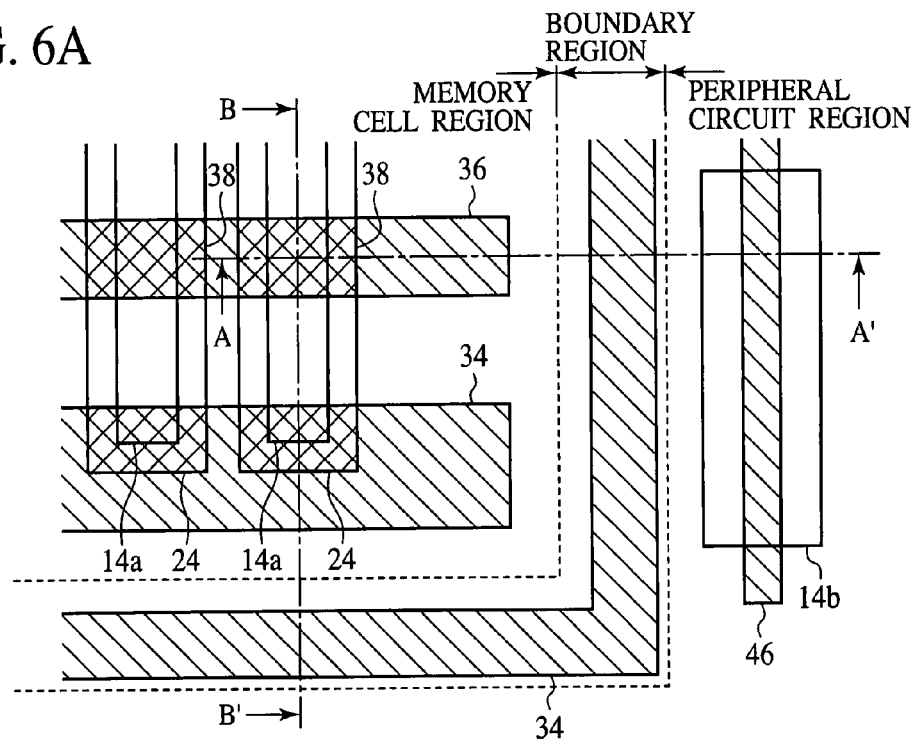
Figure 6B:
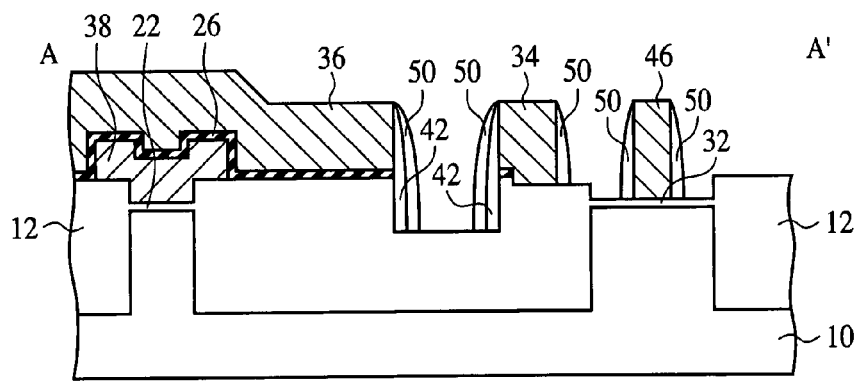
Figure 6C:
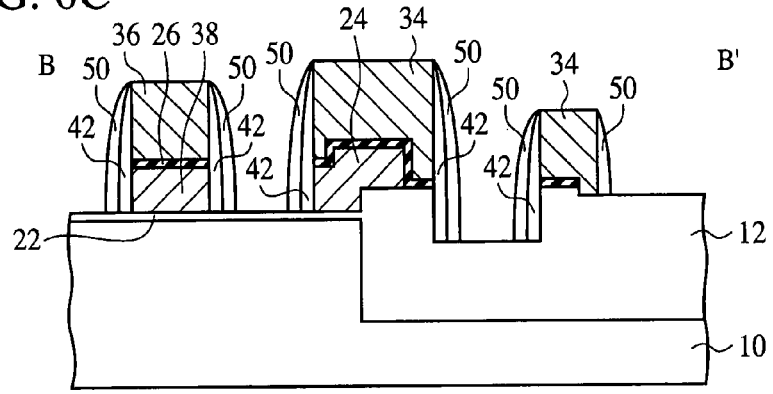

Next, a silicon oxide film is deposited on the entire surface by, e.g., CVD method and then etched back to form a sidewall insulating film 50 of the silicon oxide film on the side walls of the word lines 36, the floating gates 38, the gate electrodes 46 and the polycrystalline silicon films 24, 34 (FIGS. 6A, 6B and 6C).

Next, on the silicon substrate 10 in the nonvolatile memory transistors and the peripheral transistors formed on, a silicon nitride film and a silicon oxide film, for example, are deposited by, e.g., CVD method to form an inter-layer insulating film 56 of the layer film of these insulating films.

Figure 7A:
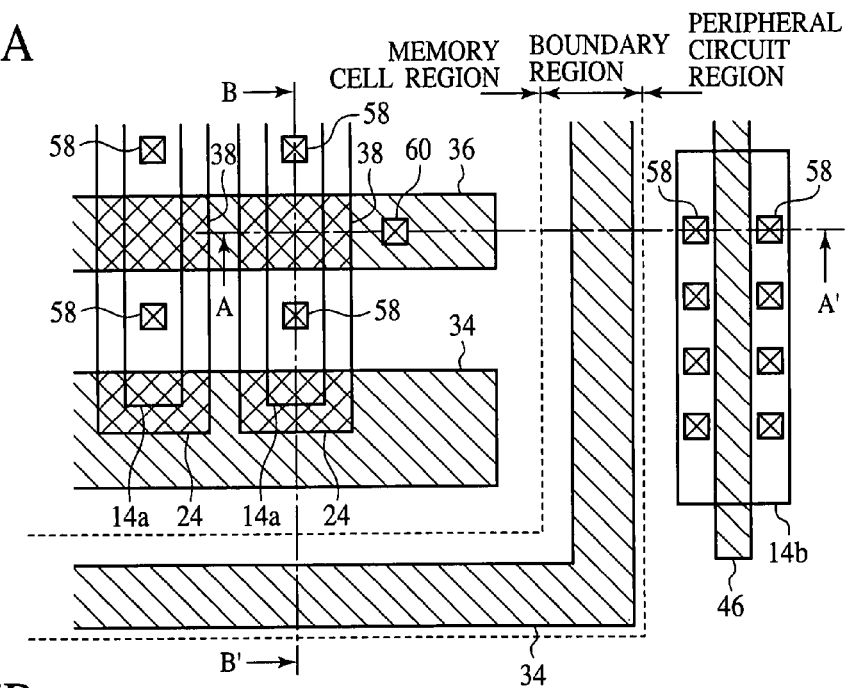
Figure 7B:
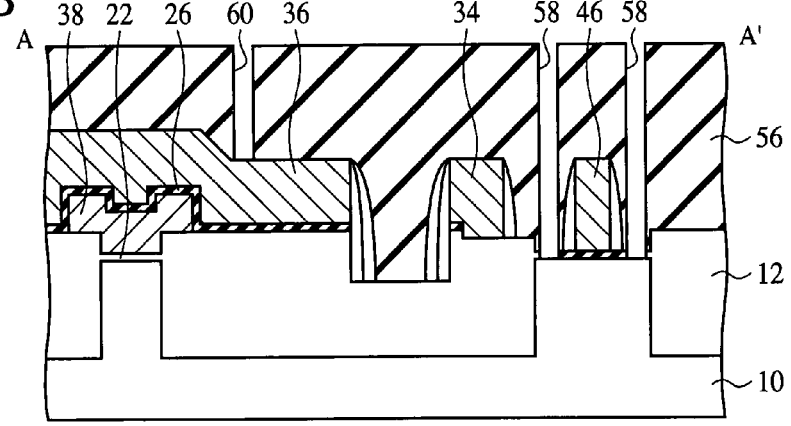
Figure 7C:
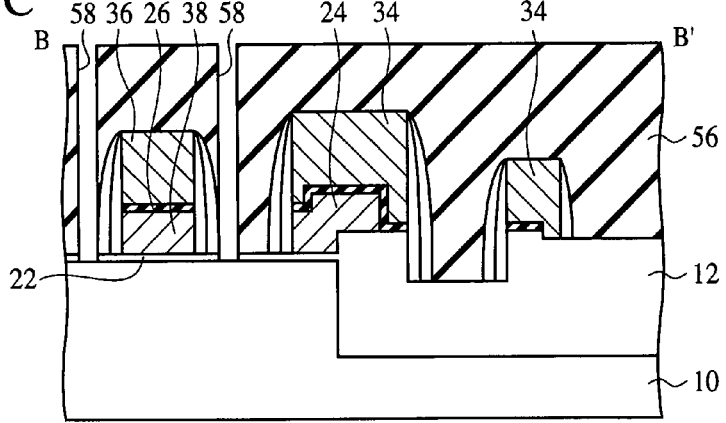

Then, the inter-layer insulating film 56 is patterned by photolithography and dry etching to form contact holes 58 reaching down to the source/drain regions, contact holes 60 reaching down to the word lines 36, etc (FIGS. 7A, 7B and 7C).

Hereafter, contact plugs buried in the contact holes 58 and a multi-level interconnection layer are formed, and the semiconductor device is completed.

The inventors of the present application examined the reference embodiment described above and found the disadvantage that the ends of the word lines 36 are etched. It was found that this disadvantage is caused by the photoresist film at the peripheral edge of the memory cell region is thinned in the step of patterning the gate electrodes 46 of the peripheral transistors (FIG. 6).

FIGS. 8A and 8B are views showing the configuration of a photoresist film 64 immediately after applied, which is used in patterning the gate electrodes 46 of the peripheral transistors. As shown in FIG. 8, it can be seen that thinning of the photoresist film 64 takes place around the regions where the recesses 62 are formed in the device isolation insulating film 12. That is, the photoresist film 64 will flow into the recesses 62 to be resultantly thinned.

In FIGS. 1A to 8B, the regions of the recesses 62 are shown narrow, but actually the recesses are formed in wide regions of above 1 μm. The depth of the recesses 62 is as deep as above 70 nm. As shown in FIG. 9, the recess regions 40 where the recesses 62 are formed (hatched in the drawings) are formed in the peripheral edge of the memory cell region and enclosing the ends of the word lines. Accordingly, thinning of the photoresist film 64 due to the recesses 62 in the peripheral edge of the memory cell region is not negligible.

It is considered that thinning of the photoresist film 64 due to the recesses 62 has conventionally taken place, but because of the sufficient thickness of the photoresist film 64, this disadvantage has not become conspicuous. However, such thinning of the photoresist film 64 will be seriously influential in future generations where the line width of the peripheral transistors will become smaller, and the photoresist film will become thinner.

Embodiment

The semiconductor device and the method of manufacturing the same according to one embodiment of the present invention will be explained with reference to FIGS. 10 to 22B.

Figure 10:
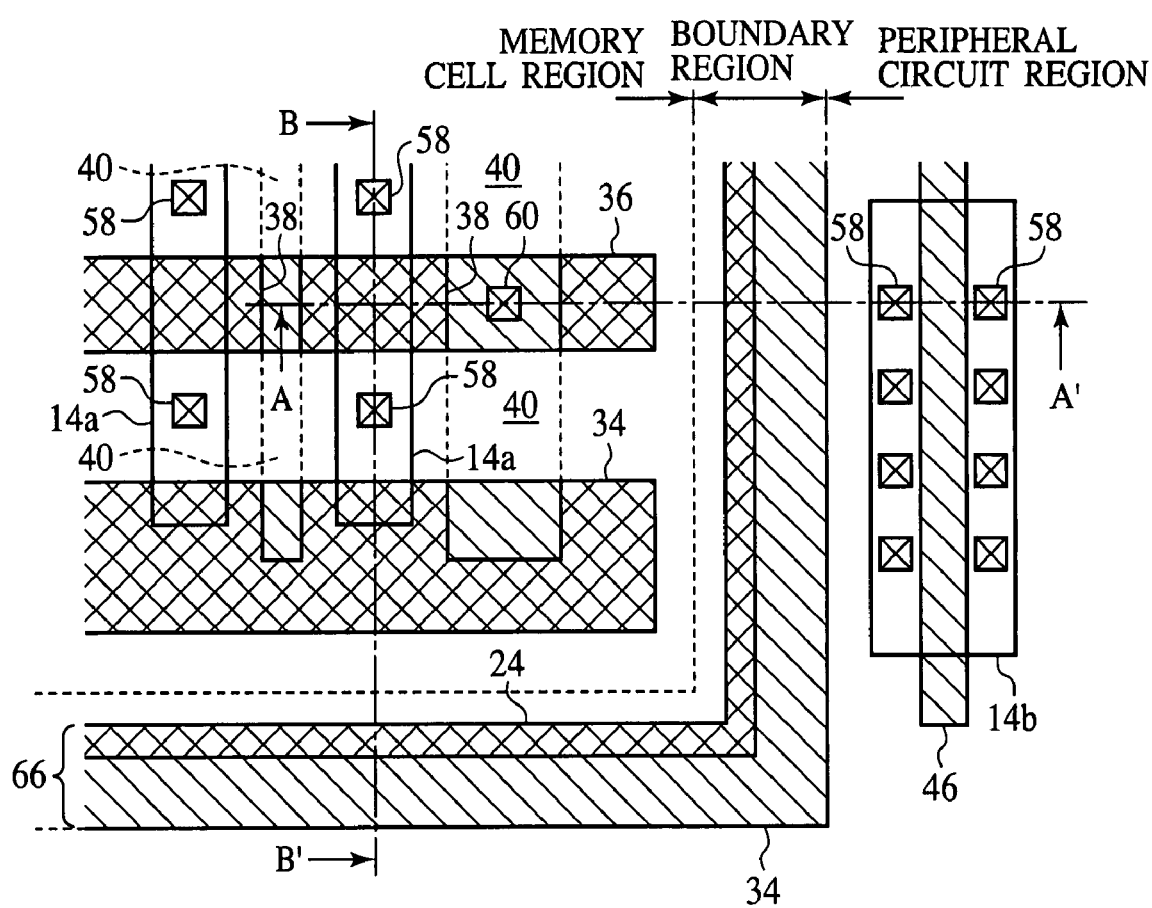
FIG. 10 is a plan view showing the structure of the semiconductor device according to one embodiment of the present invention.
Figure 11A:
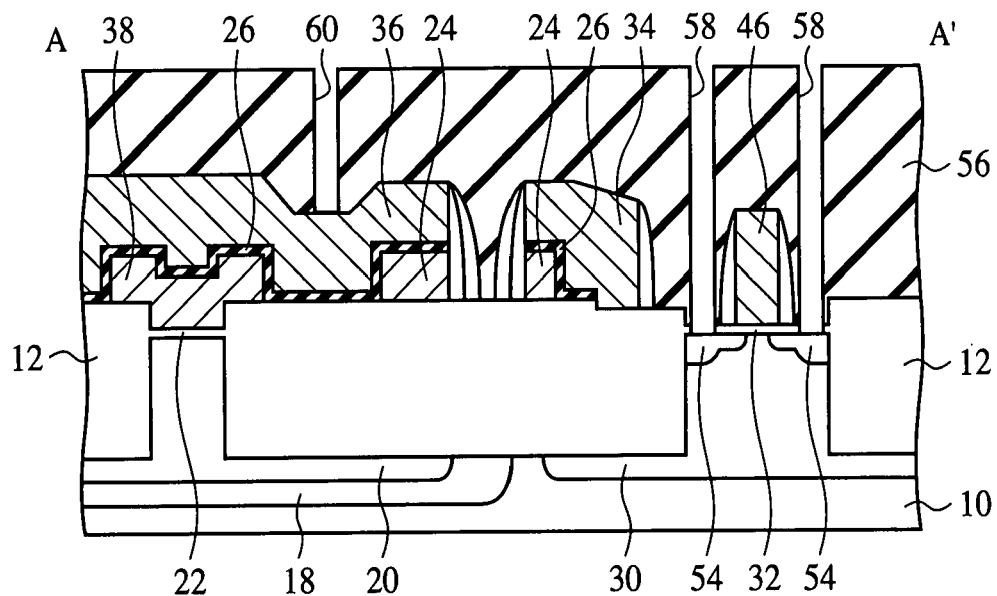
FIG. 11 is a diagrammatic sectional view showing the structure of the semiconductor device according to one embodiment of the present invention.
Figure 11B:
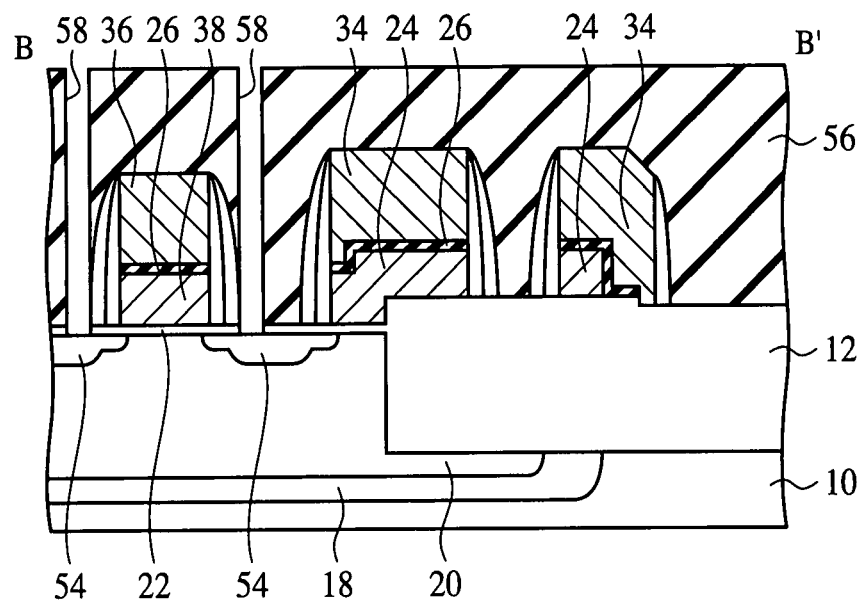
Figure 12:
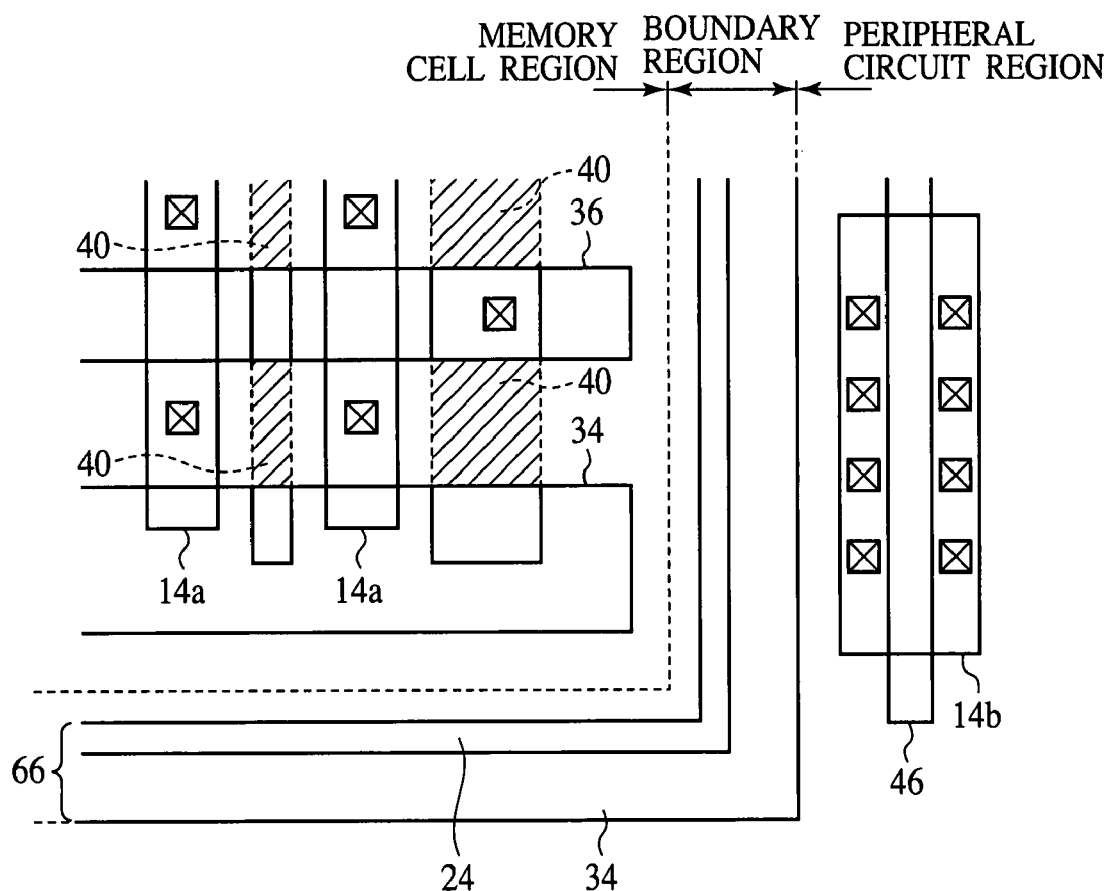
FIG. 12 is a plan view showing the recess region in the memory cell region of the semiconductor device according to one embodiment of the present invention.
Figure 21A:
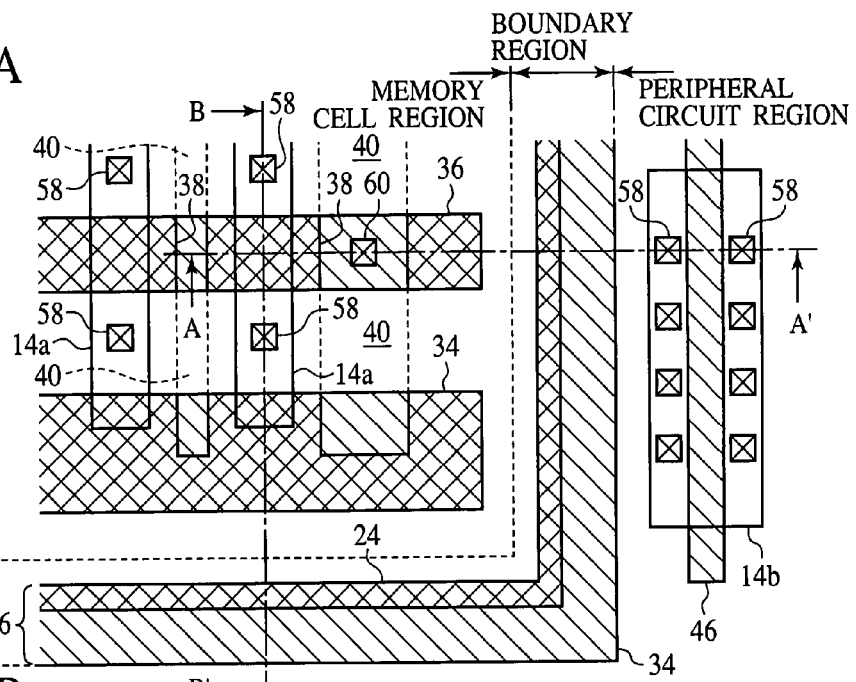
Figure 21B:
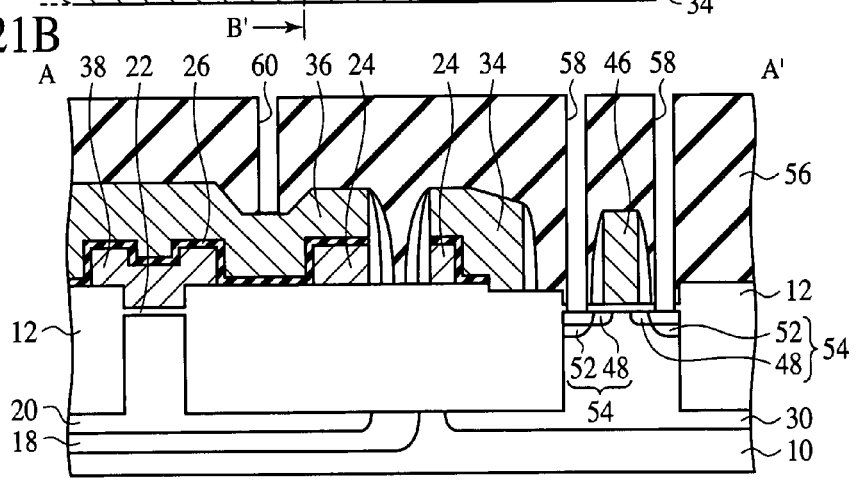
Figure 21C:
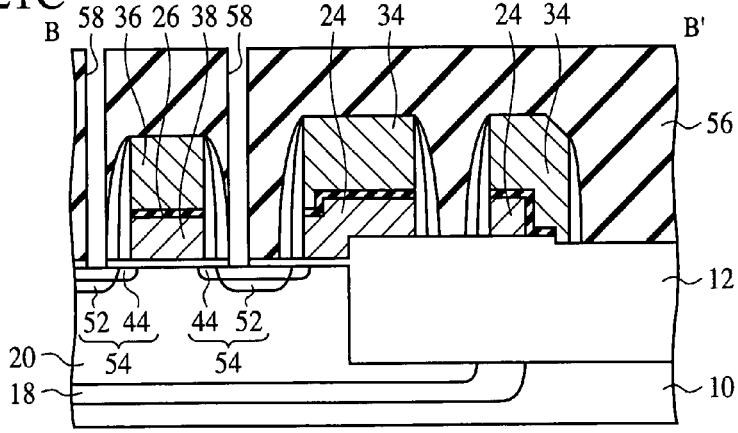
Figure 22A:
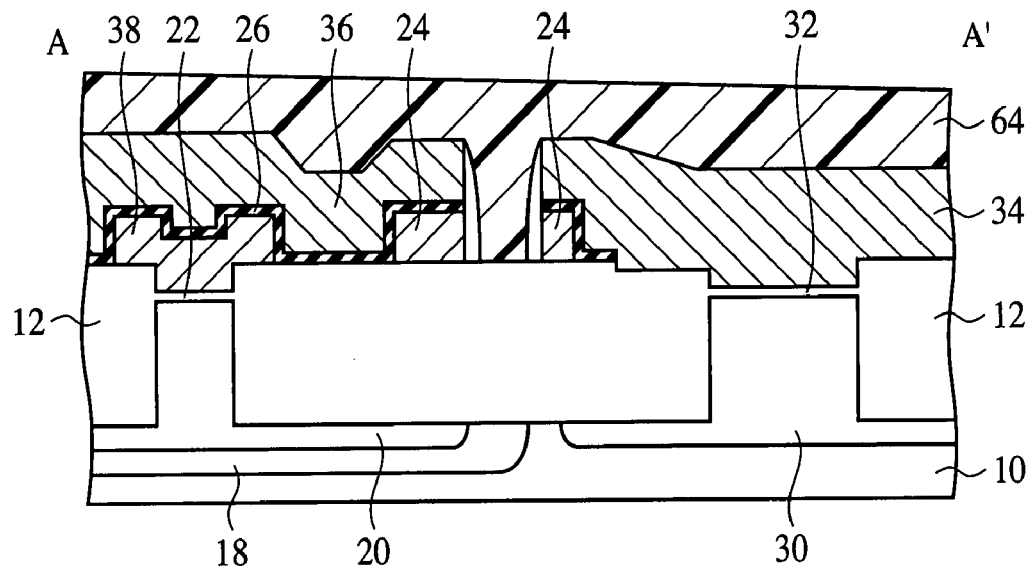
Figure 22B:
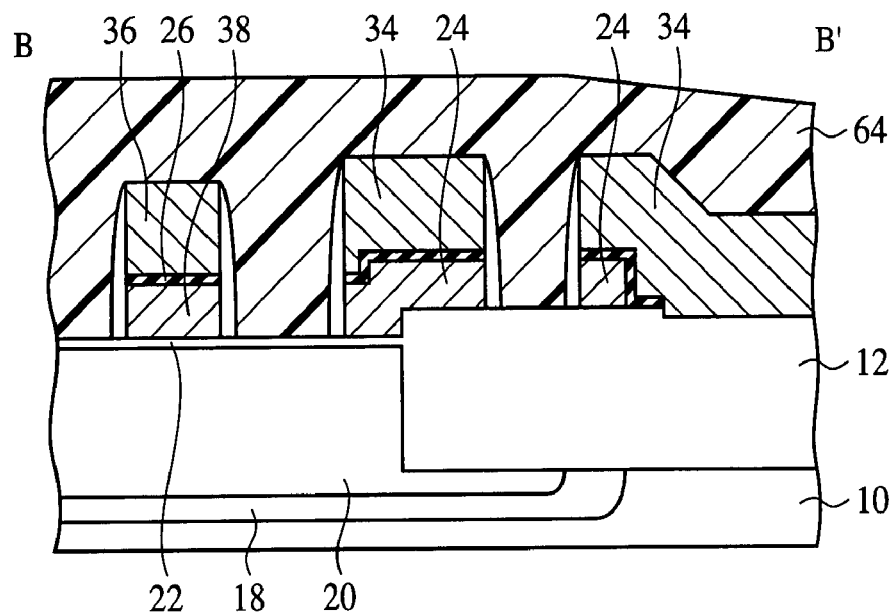

FIG. 10 is a plan view showing the structure of the semiconductor device according to the present embodiment. FIGS. 11A and 11B are diagrammatic sectional views showing a structure of the semiconductor device according to the present embodiment. FIG. 12 is a plan view showing the recess regions in the memory cell region of the semiconductor device according to the present embodiment. FIGS. 13A to 21C are sectional views showing the method of manufacturing the semiconductor device according to the present embodiment. FIGS. 22A and 22B are views showing the configuration of the photoresist film in the periphery of the memory cell region.

First, the structure of the semiconductor device according to the present embodiment will be explained with reference to FIGS. 10 to 12.

As shown in FIG. 10, the semiconductor device according to the present embodiment includes a memory cell region (the first region) where nonvolatile memory transistors (the first transistors) of the stacked gate structure are formed in a matrix, and a peripheral circuit region (the second region) where various peripheral transistors (the second transistors), such as logic transistors forming a logic circuit, high-voltage transistors for driving the nonvolatile memory transistors, etc., are formed. A boundary region for ensuring the isolation of the respective regions, ensuring processing margins, etc. is provided between the memory cell region and the peripheral circuit region. The boundary region is provided, all around the memory cell region.

In the memory cell region, a double-well including an n-well 18 formed in the silicon substrate 10 and a p-well 20 formed in the n-well is formed. Active regions 14a are formed on the surface of the silicon substrate 10 in the p-wells 20, defined by a device isolation insulating film 12.

On each active region 14a, a tunnel gate insulating film 22, a floating gate 38, an ONO film 26 and a control gate (a word line 36) are laid the latter on the former. In the active regions 14a on both sides of the control gate, source/drain regions 54 are formed. Thus, in the memory cell region, the nonvolatile memory transistors each including the gate electrode of stacked structure (the first gate electrode) including the floating gate and the control gate, and the source/drain regions 54 are formed. The control gates of the nonvolatile memory transistors are parts of the word lines 36 interconnecting the control gates of a plurality of nonvolatile memory transistors arranged horizontally as viewed in the drawing.

P-well 30 is formed in the silicon substrate 10 in the peripheral circuit region. On the surface of the silicon substrate 10 in the P-well 30, active regions 14b is formed, defined by the device isolation insulating film 12. In the present embodiment, the n-channel transistors alone formed in the p-well 30 will be explained, but actually the semiconductor device includes n-wells, p-channel transistors formed in the n-wells, etc. P-wells and n-wells of plural kinds are often formed.

On each active region 14b, a gate electrode 46 (the second gate electrode) is formed with the gate insulating film 32 interposed therebetween. In the active region 14b on both sides of the gate electrode 46, source/drain regions 54 are formed. Thus, in the peripheral circuit region, the peripheral transistor including the gate electrode and the source/drain regions 54 is formed.

In the boundary region, a gate interconnection 66 of the polycrystalline silicon film 24 of the same conductive layer forming the floating gates and the polycrystalline silicon film 34 of the same conduction layer forming the gate electrodes 46 laid the latter on the former with the ONO film 26 formed therebetween (stacked body) is formed, enclosing the memory cell region. The gate interconnection 66 is formed attendant on the step of discriminately forming the elements in the memory cell region and the elements in the peripheral circuit region and is not a functional interconnection necessary for the semiconductor device.

An inter-layer insulating film 56 is formed over the silicon substrate 10 with the nonvolatile memory transistors, the peripheral transistor, etc. formed on. In the inter-layer insulating film 56, contact holes 58 reaching down to the source/drain regions 54 and a contact hole 60 reaching down to the word line 36 are formed.

FIG. 12 shows recess regions where recesses 62 are formed in the device isolation insulating film 12. In the drawing, the hatched parts are the recess regions 40. As shown in FIG. 12, in the semiconductor device according to the present embodiment as well as the reference embodiment described above, the formation of the recess regions 40 in the device isolation insulating film 12 cannot be prevented. In the semiconductor device according to the present embodiment, however, the area of the recess regions 40 can be much decreased in comparison with those of the above-described reference embodiment shown in FIG. 9. The recess regions 40 are not formed, enclosing the memory cell region. Accordingly, thinning of the photoresist film in the peripheral edge of the memory cell region due to the recesses 62 can be suppressed.

Then, the method of manufacturing the semiconductor device according to the present embodiment will be explained with reference to FIGS. 13A to 22B. In each of FIGS. 13 to 22, (A) is a plan view of the neighborhood of the boundary region between the memory cell region and the peripheral circuit region in the steps of the manufacturing method, (B) is the sectional view along the line A-A' in (A) in the steps of the manufacturing method, and (C) is the sectional view along the line B-B' in (A) in the steps of the manufacturing method.

First, the device isolation insulating film 12 for defining the device regions 14a and 14b are formed in the silicon substrate 10 by, e.g., STI (Shallow Trench Isolation) method. Here, the device regions 14a where the nonvolatile memory transistors are to be formed are formed in the memory cell region, and the device regions 14b where the logic transistors are to be formed are formed in the peripheral circuit region.

Next, the silicon substrate 10 is thermally oxidized by, e.g., thermal oxidation to form a silicon oxide film 16 as a sacrificial oxidation film on the device regions 14a, 14b.

Figure 13A:
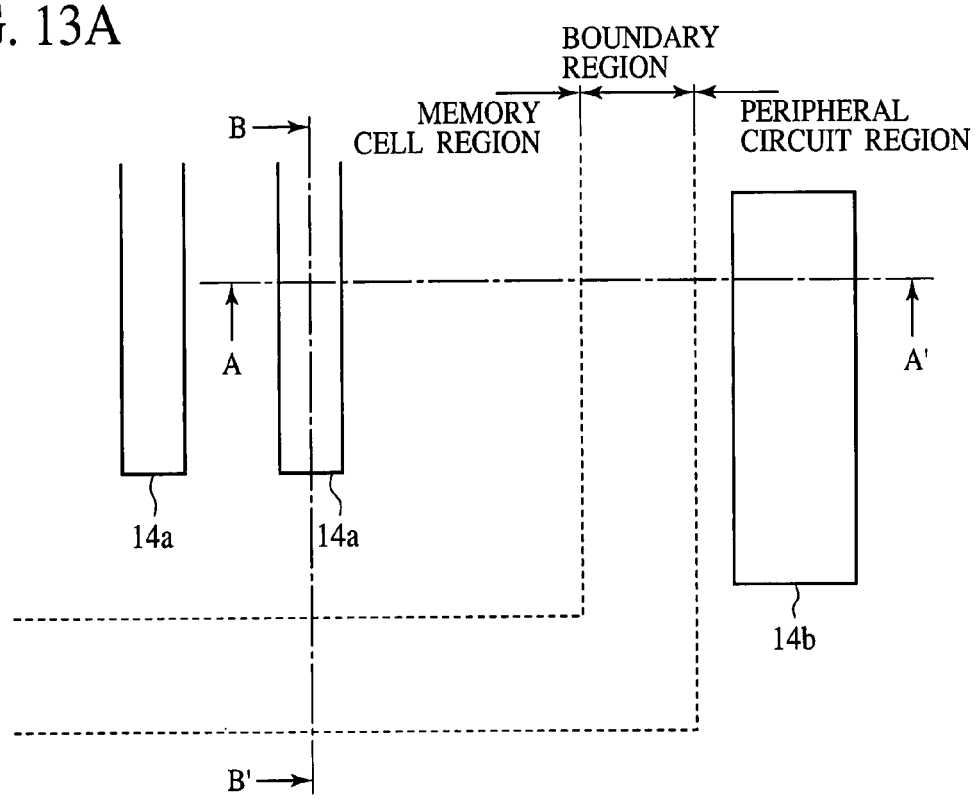
FIGS. 13A-13C, 14A-14C, 15A-15C, 16A-16C, 17A-17C, 18A-18C, 19A-19C, 20A-20C, 21A-21C and 22A-22B are views showing the method of manufacturing the semiconductor device according to one embodiment of the present invention.
Figure 13B:
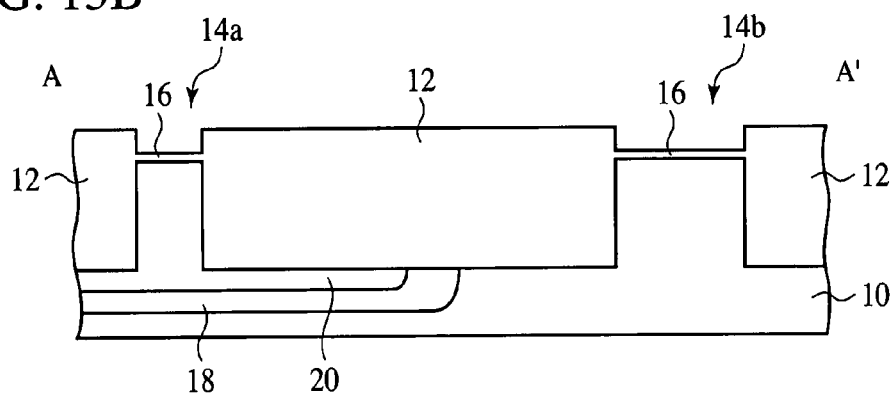
Figure 13C:
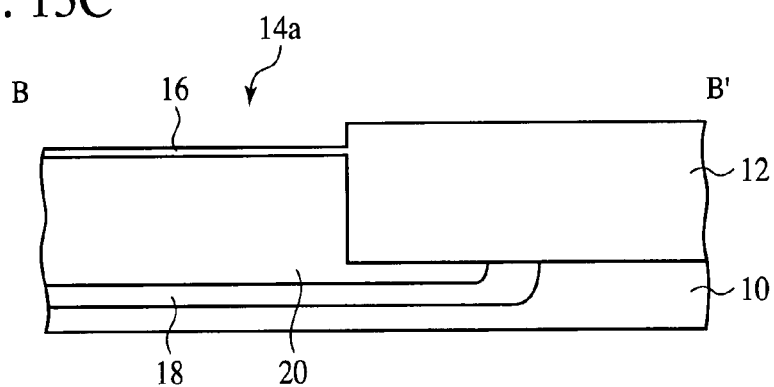

Then, ion implantation is made selectively in the memory cell region to form the n-well 18 and the p-well 20 (FIGS. 13A, 13B and 13C). The p-well 20 is a double-well formed in the n-well 18. Here, the n-well 18 and the p-well 20 are actually formed by activating implanted impurities by thermal processing in the later steps.

Next, the silicon oxide film 16 is removed by a hydrofluoric acid aqueous solution.

Next, the silicon substrate 10 is thermally oxidized by, e.g., thermal oxidation method to form the tunnel gate insulating film 22 of a silicon oxide film on the surfaces of the device regions 14a, 14b exposed by removing the silicon oxide film 16.

Next, on the silicon substrate 10 with the tunnel gate insulating film 22 formed on, a polycrystalline silicon film 24 (the first conductive film) of, e.g., a 90 nm-thickness is deposited by, e.g., CVD method. The polycrystalline silicon film 24 is a conductive film to be the floating gates.

Figure 14A:
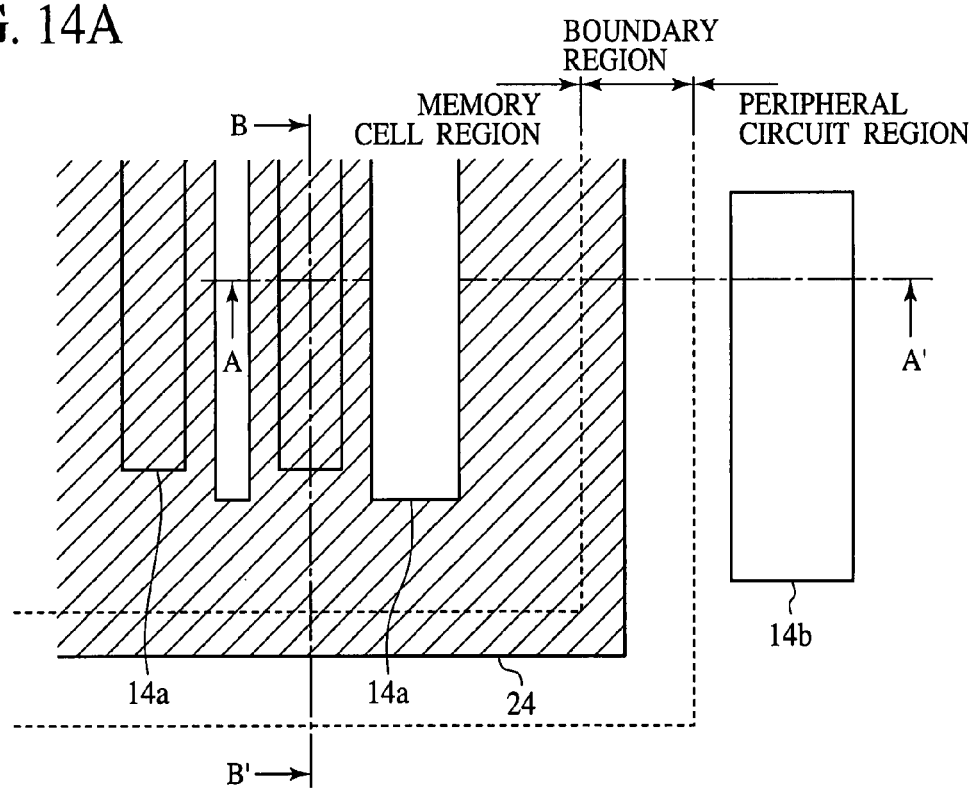
Figure 14B:
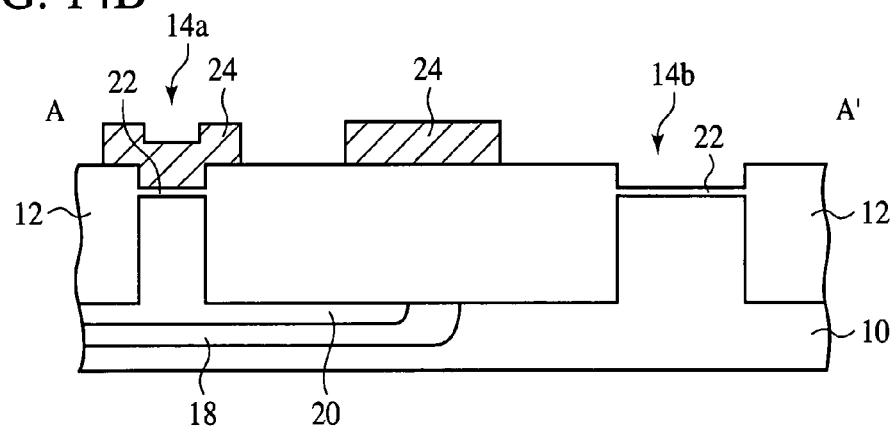
Figure 14C:
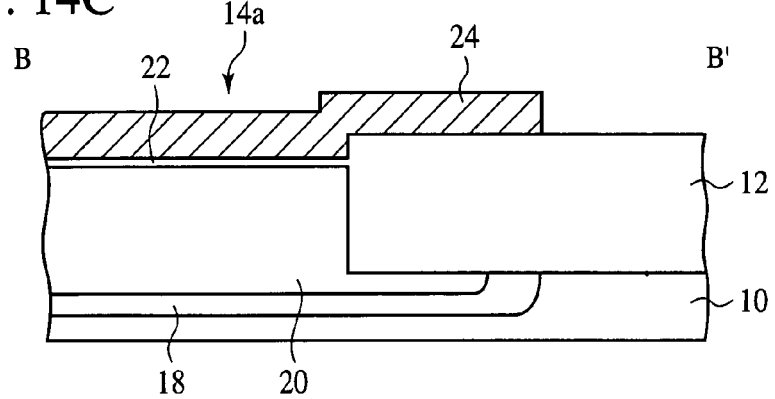

Next, by photolithography and dry etching, the polycrystalline silicon film 24 is patterned (FIGS. 14A, 14B and 14C). This patterning is for the preparatory processing for isolating the floating gates 38 of the nonvolatile memory transistors neighboring in the extending direction of the word lines 36 (horizontally in the drawing) and the removal of the polycrystalline silicon film 24 in the peripheral circuit region.

At this time, in the method of manufacturing the semiconductor device according to the present embodiment, the polycrystalline silicon film 24 is patterned so that the outer edge of the polycrystalline silicon film 24 is positioned in the boundary region between the memory cell region and the peripheral circuit region (see FIG. 14A). In comparison with the reference embodiment described above, this pattern can be considered to be the pattern of the polycrystalline silicon film 24 shown in FIG. 2 with a circular pattern added, which is provided along the edge of the memory cell region and is extended in the boundary region.

Figure 15A:
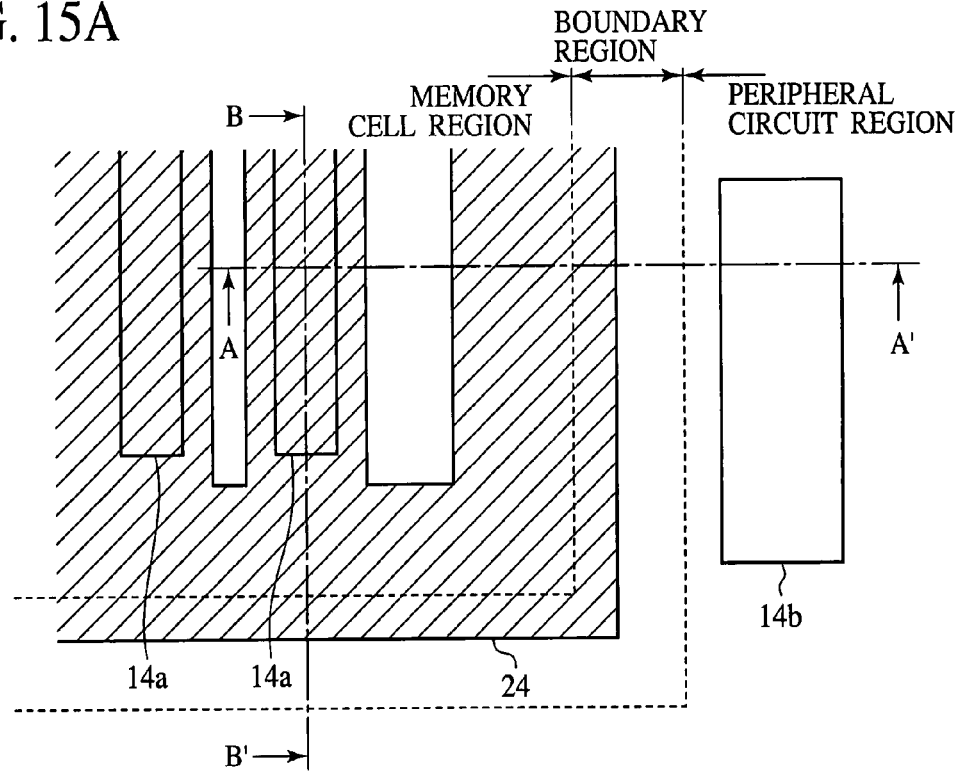
Figure 15B:
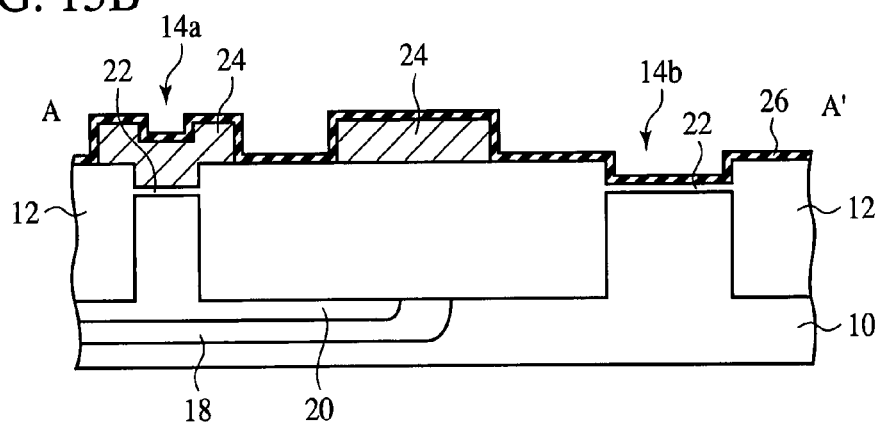
Figure 15C:
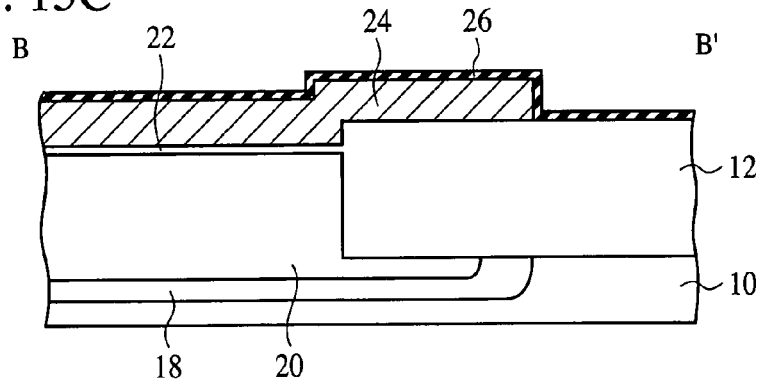

Then, a silicon oxide film and a silicon nitride film are deposited on the entire surface by, e.g., CVD method, and then the silicon oxide film is grown by thermal oxidation to form the ONO film 26 (the first insulating film) of the silicon oxide film/silicon nitride film/silicon oxide film (FIGS. 15A, 15B, 15C). The ONO film 26 includes the bottom oxide film of, e.g., 5 nm-thickness, the silicon nitride film of, e.g., a 5 nm-thickness and the top oxide film of, e.g., a 5 nm-thickness.

Figure 16A:
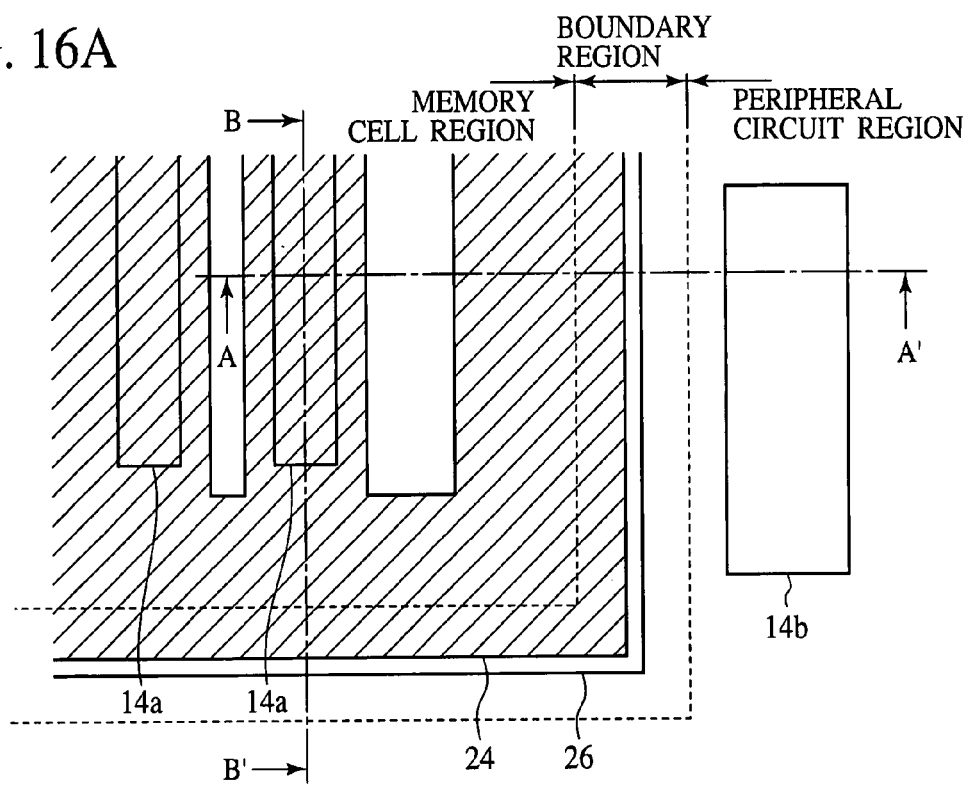
Figure 16B:
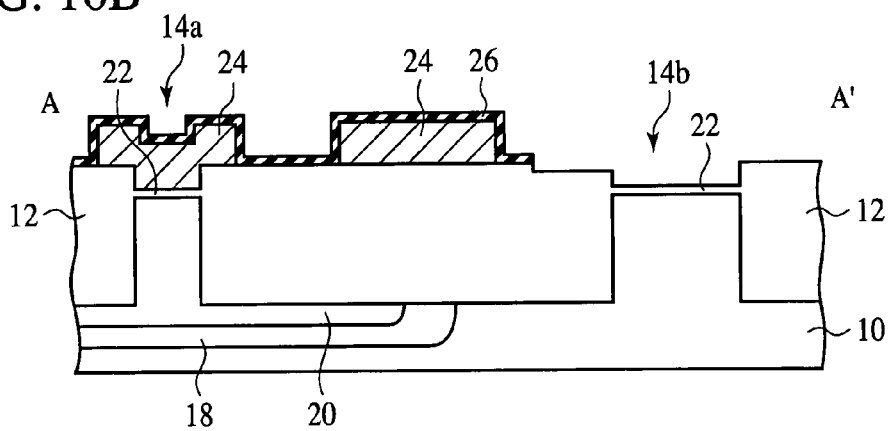
Figure 16C:
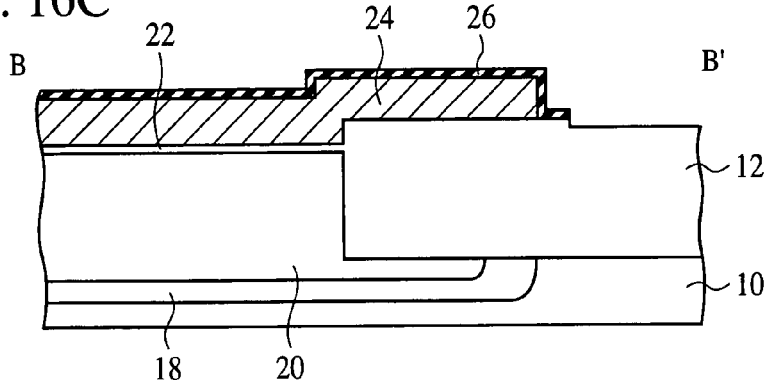

Then, the ONO film 26 in the peripheral circuit region is selectively removed by photolithography and dry etching (FIGS. 16A, 16B and 16C). The outer edge of the ONO film 26 is positioned outer of the outer edge of the polycrystalline silicon film 24 in the boundary region between the memory cell region and the peripheral circuit region (see FIG. 16A).

Then, ion implantation is made selectively in the peripheral circuit region to form the p-well 30. Here, the p-wells 30 are formed actually by activating the impurity by thermal processing in a later step.

Then, by photolithography and wet etching, the tunnel gate insulating film 22 formed in the device regions 14b in the peripheral circuit region is selectively removed.

Then, the silicon substrate 10 is thermally oxidized by, e.g., thermal oxidation method to form the gate insulating film 32 of silicon oxide film in the device regions 14b in the peripheral circuit region. In place of silicon oxide film, silicon oxynitride film may be formed.

Figure 17A:
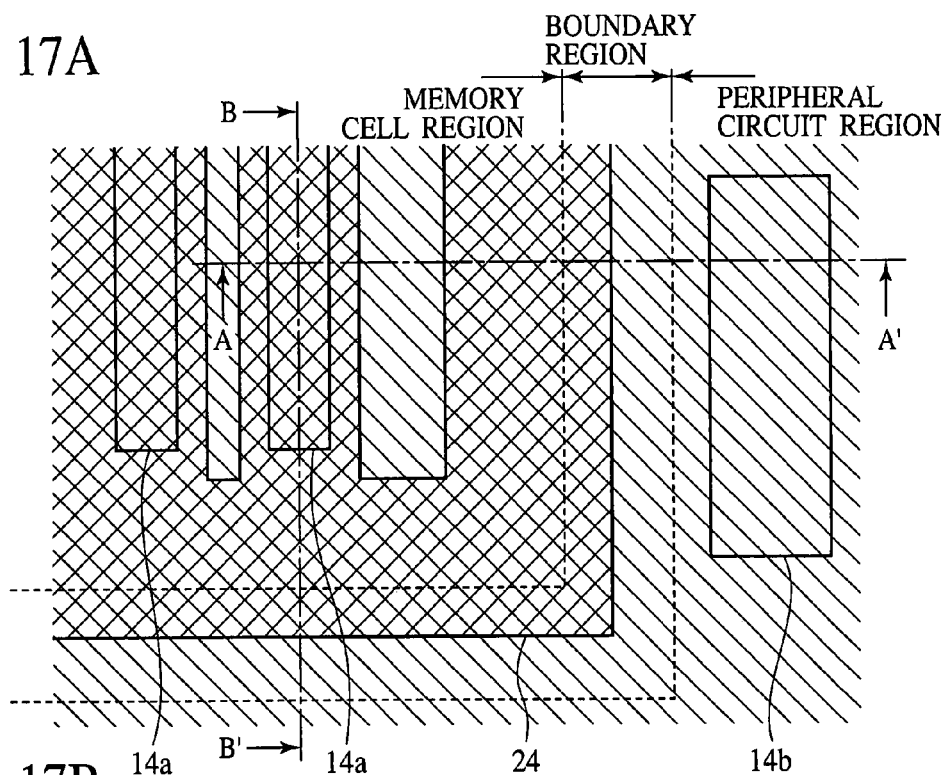
Figure 17B:
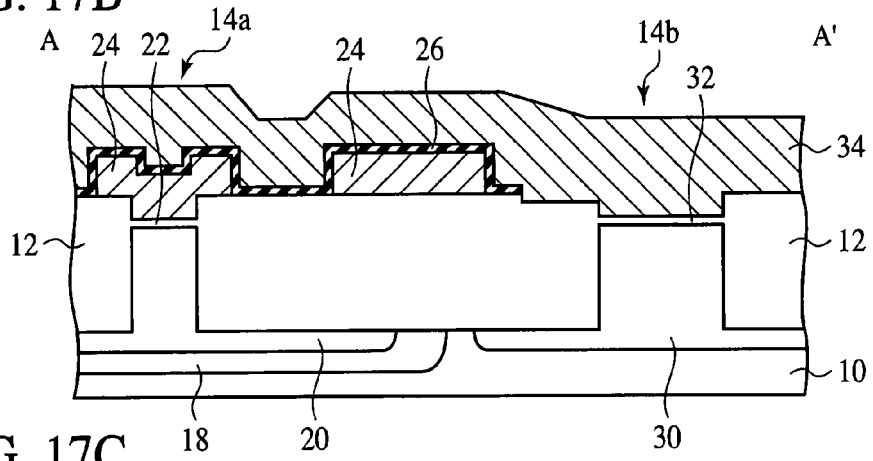
Figure 17C:
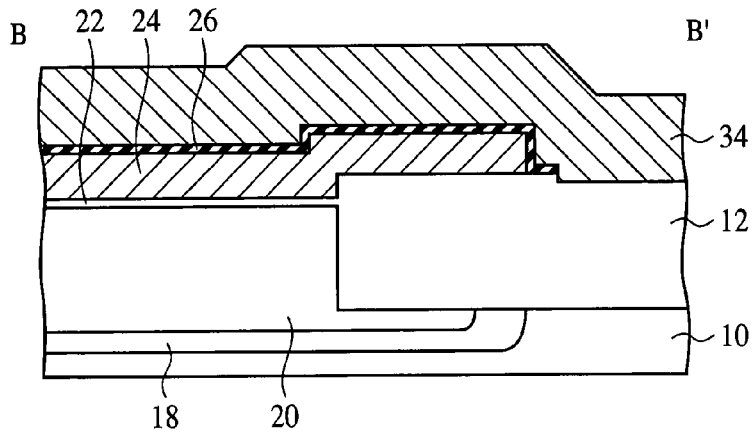

Then, the polycrystalline silicon film 34 (the second conductive film) is deposited on the entire surface by, e.g., CVD method (FIGS. 17A, 17B and 17C). The polycrystalline silicon film 34 is to be a conductive film to be the control gates (word lines 36) of the nonvolatile memory transistors and the gate electrode (gate electrodes 46) of the peripheral transistor.

Figure 18A:
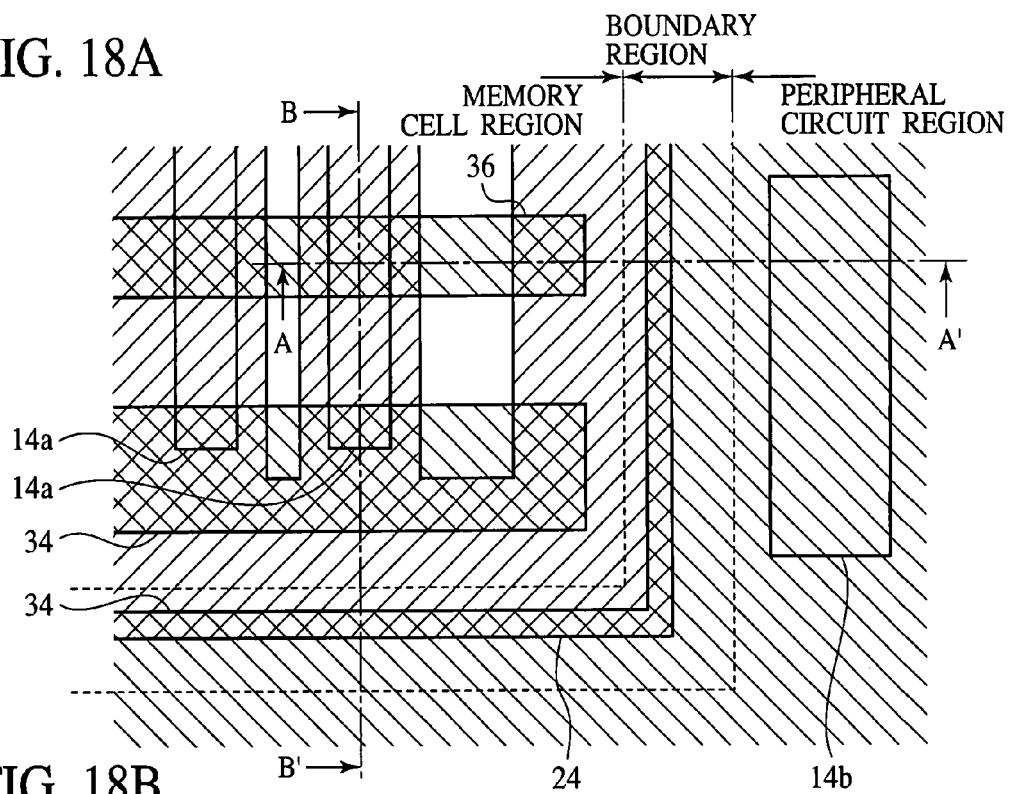
Figure 18B:
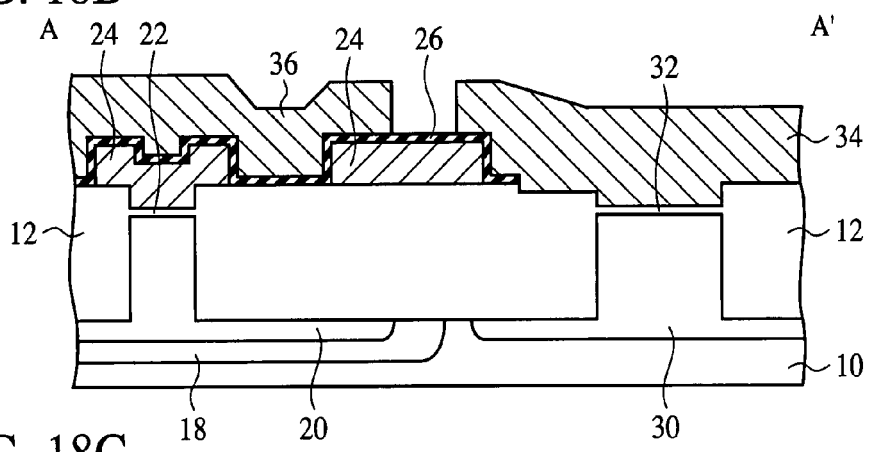
Figure 18C:
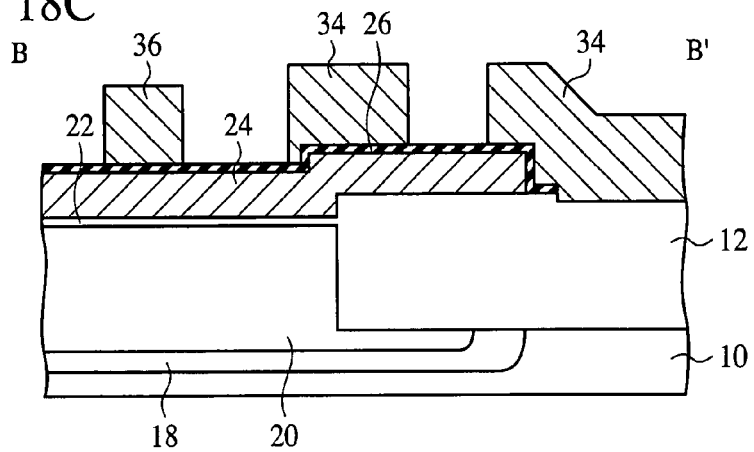

Next, by photolithography and dry etching, the polycrystalline silicon film 34 in the memory cell region is patterned to form the word lines 36 which function as the control gates of the nonvolatile memory transistors (FIGS. 18A, 18B and 18C).

At this time, the polycrystalline silicon film 34 covering the edges of the device regions 14a in the memory cell region and in the peripheral circuit region is left.

Preferably, the ends of the word lines 36 are extended over the circular pattern of the polycrystalline silicon film 24. The formation of the recesses 62 near the ends of the word lines 36 can be thus prevented.

The inner edge of the polycrystalline silicon film 34 covering the peripheral circuit region is positioned inner of the outer edge of the polycrystalline silicon film 24 in the boundary region between the memory cell region and the peripheral circuit region (see FIG. 18A).

Then, the ONO film 26 and the polycrystalline silicon film 24 are patterned by dry etching using the photoresist film which was used for patterning the polycrystalline silicon film 34 as a mask. Thus, the floating gates 36 of the polycrystalline silicon film 24 are formed below the word lines 36. In the boundary region, an opening is formed in the layer structure of the polycrystalline silicon film 24 and the polycrystalline silicon film 34 reaching down to the device isolation insulating film 12, and the polycrystalline silicon film 24 is isolated from each other between the memory cell region and the boundary region.

At this time, in the regions 40 where the polycrystalline silicon film 24 is not formed (recess regions 40), the device isolation insulating film 12 is etched when the ONO film 26 is etched, and the recesses 62 are formed. However, in the method of manufacturing the semiconductor device according to the present invention, as shown in FIG. 12, the recess regions 40 can be much narrowed in comparison with the recess regions 40 of the above-described reference embodiment shown in FIG. 9, and the recess regions 40 are never formed, enclosing the memory cell region.

Then, with a photoresist film covering the peripheral circuit region (not shown), the word lines 36 and the floating gates 38 as the mask, ion implantation is made selectively in the memory cell region to form an impurity diffused regions 40 to be the LDD regions or the extension regions of the nonvolatile memory transistors in the device regions 14a on both sides of the word lines 36.

Figure 19A:
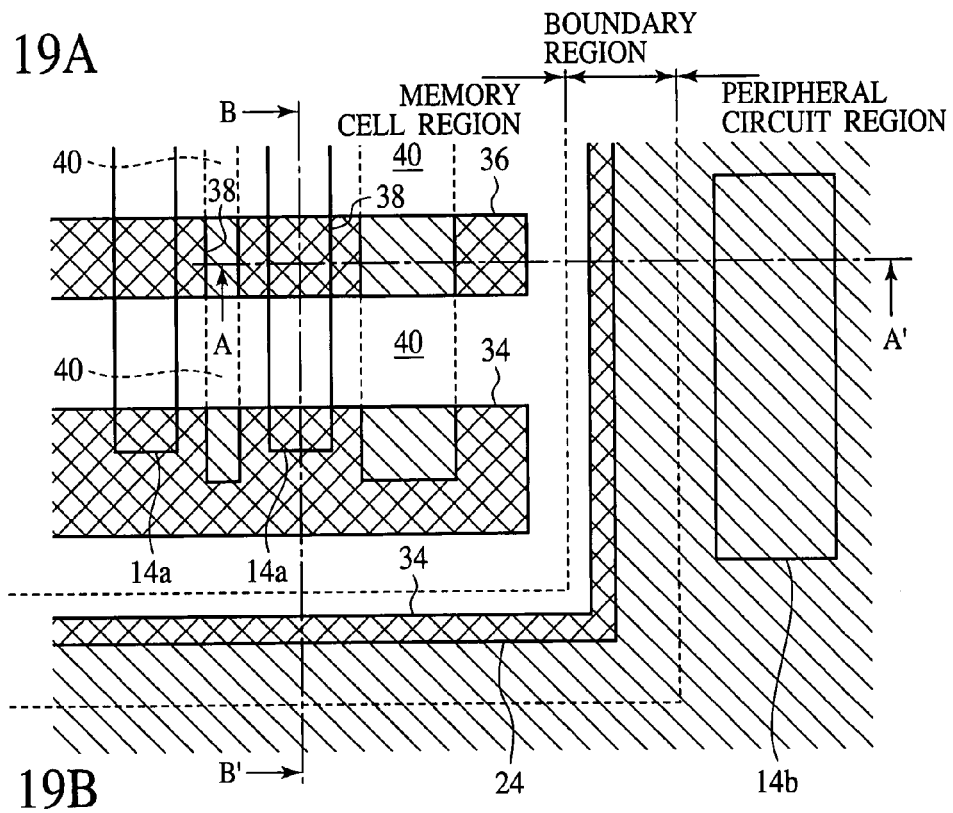
Figure 19B:
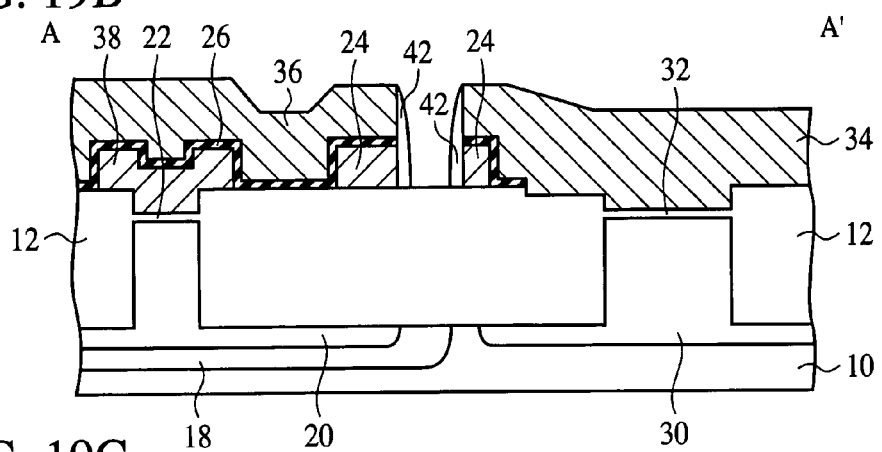
Figure 19C:
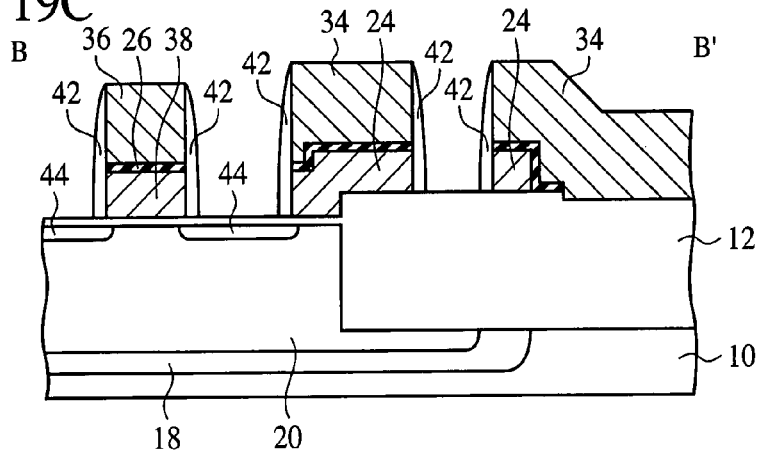

Next, a silicon nitride film is deposited on the entire surface by, e.g., CVD method, and then the silicon nitride film is etched back to form the sidewall insulating film 42 of the silicon nitride film on the side walls of the word lines 36, the floating gates 38 and the polycrystalline silicon films 24, 34 (FIG. 19A, 19B and 19C).

Next, by photolithography and dry etching, the polycrystalline silicon film 34 in the peripheral circuit region is patterned to form the gate electrode 46 of the peripheral transistor.

At this time, in the method of manufacturing the semiconductor device according to the present embodiment, the recess regions 40 in the device isolation insulating film 12 can be much narrowed (see FIG. 12), whereby the photoresist film 64 can be prevented from flowing into the recesses 62 (see FIGS. 8, 22A and 22B), and the photoresist film 64 is prevented from being thinned at the ends of the word lines 36. The ends of the word lines 36 are thus prevented from being etched.

Then, with the photoresist film covering the memory cell region (not shown) and the gate electrode 46 as the mask, ion implantation is made selectively in the peripheral circuit region to form an impurity diffused regions 48 to be the LDD regions or the extension regions of the peripheral transistor in the device region 14b on both sides of the gate electrode 46.

Figure 20A:
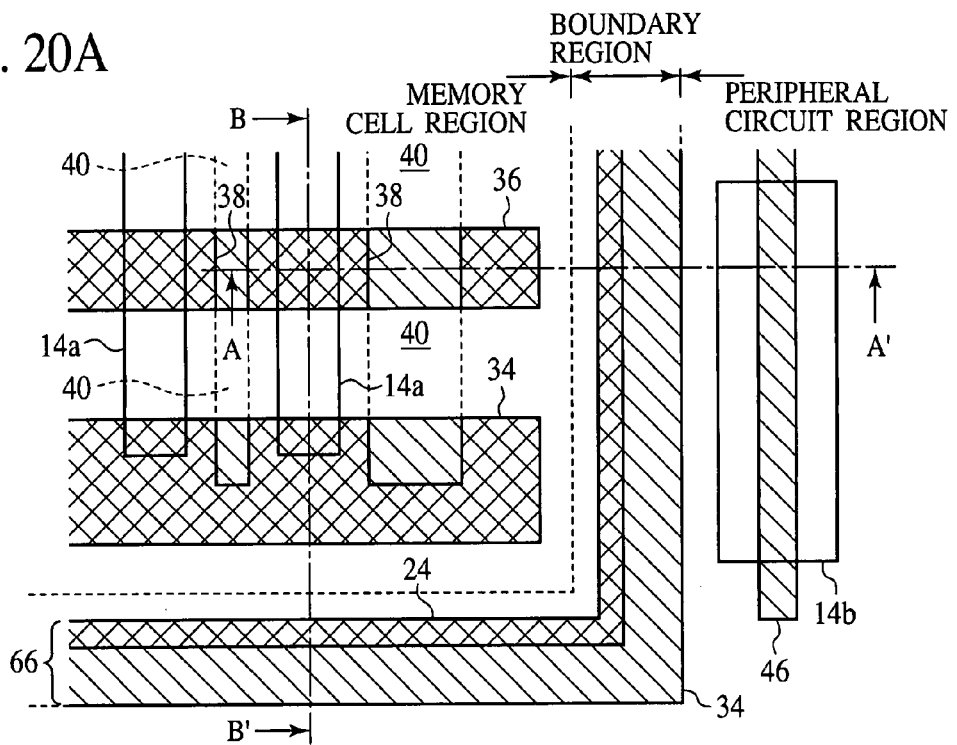
Figure 20B:
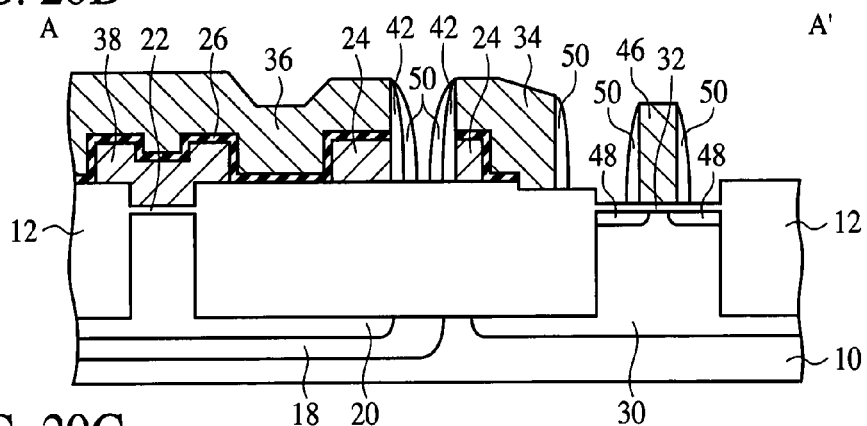
Figure 20C:
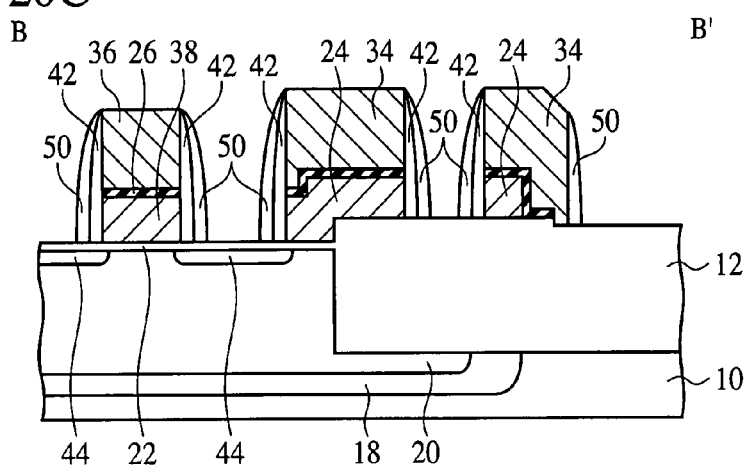

Next, a silicon oxide film is deposited on the entire surface by, e.g., CVD method, and then the silicon oxide film is etched back to form the sidewall insulating film 50 of the silicon oxide film on the side walls of the word lines 36, the floating gates 38, the gate electrode 46 and the polycrystalline silicon films 24, 34 (FIGS. 20A, 20B and 20C).

Then, ion implantation is made with the word lines 36, the floating gates 38, the gate electrode 46 and the sidewall insulating films 42, 50 as the mask to form impurity diffused regions 52 in the device regions 14a on both sides of the word lines 36 and in the device region 14b on both sides of the gate electrode 46. Thus, the source/drain regions 54 of the impurity diffused regions 40, 52 are formed in the device regions 14a on both sides of the word lines 36, and the source/drain regions 54 of the impurity diffused regions 48, 52 are formed in the device region 14b on both sides of the gate electrode 46.

Then, on the source/drain regions 54 and the gate electrodes of the respective transistors (the word lines 36, the gate electrodes 46), a metal silicide film (not shown) is formed by salicide (self-aligned silicide) process as required.

Next, over the silicon substrate 10 with the nonvolatile memory transistors and the peripheral transistor formed on, a silicon nitride film and a silicon oxide film, for example, are deposited by, e.g., CVD method to form the inter-layer insulating film 56 of the layer film of these insulating films.

Then, the inter-layer insulating film 56 is patterned by photolithography and dry etching to form the contact holes 58 reaching down to the source/drain regions 54, the contact hole 60 reaching down to the word lines 36, etc. (FIGS. 21A, 21B and 21C).

Then, the contact plugs buried in the contact holes 58, 60 and the upper multi-level interconnection layer are formed, and the semiconductor device is completed.

As described above, according to the present embodiment, the polycrystalline silicon film to be the floating gates is patterned so that the outer edge is positioned in the boundary region between the memory cell region and the peripheral circuit region, whereby when the ONO film and the polycrystalline silicon film in the memory cell region are patterned to form the floating gates, the regions where the device isolation insulating film at the edge of the memory cell region is etched, and the recesses are formed can be much decreased. Thus, the photoresist film used in forming the gate electrode of the peripheral transistor can be prevented from flowing in a large amount into the recesses in the device isolation insulating film, and the photoresist film can be prevented from being thinned in the memory cell region. Thus, the ends of the word lines can be prevented from being etched when the gate electrode of the peripheral transistor is formed.

Modified Embodiments

The present invention is not limited to the above-described embodiment and can cover other various modifications.

For example, in the above-described embodiment, the semiconductor device according to the present invention as been described by means of a logic semiconductor device combined with nonvolatile memory transistors. Yet the present invention is applicable widely to the semiconductor devices including a nonvolatile memory transistor having a gate electrode of the stacked structure and a peripheral transistor having a gate electrode of a single-layer structure.

In the above-described embodiment, the contact hole 60 for the connection to the word line 36 is opened in the region where the polycrystalline silicon film 34, which is the same conductive layer forming the floating gate 38, is not formed. However, as shown in FIGS. 23A and 23B, the polycrystalline silicon film 34, which is the same conductive layer forming the floating gates 38, may be extended in the region where the contact hole 60 is formed.

In the above-described embodiment, in view of concurrently opening the contact holes 58, 60, the contact holes 58, 60 are made approximate in depth by removing the polycrystalline silicon film 24 in the region where the contact hole is to be formed so as to facilitate the etching of the contact holes 58, 60.

Figure 23A:
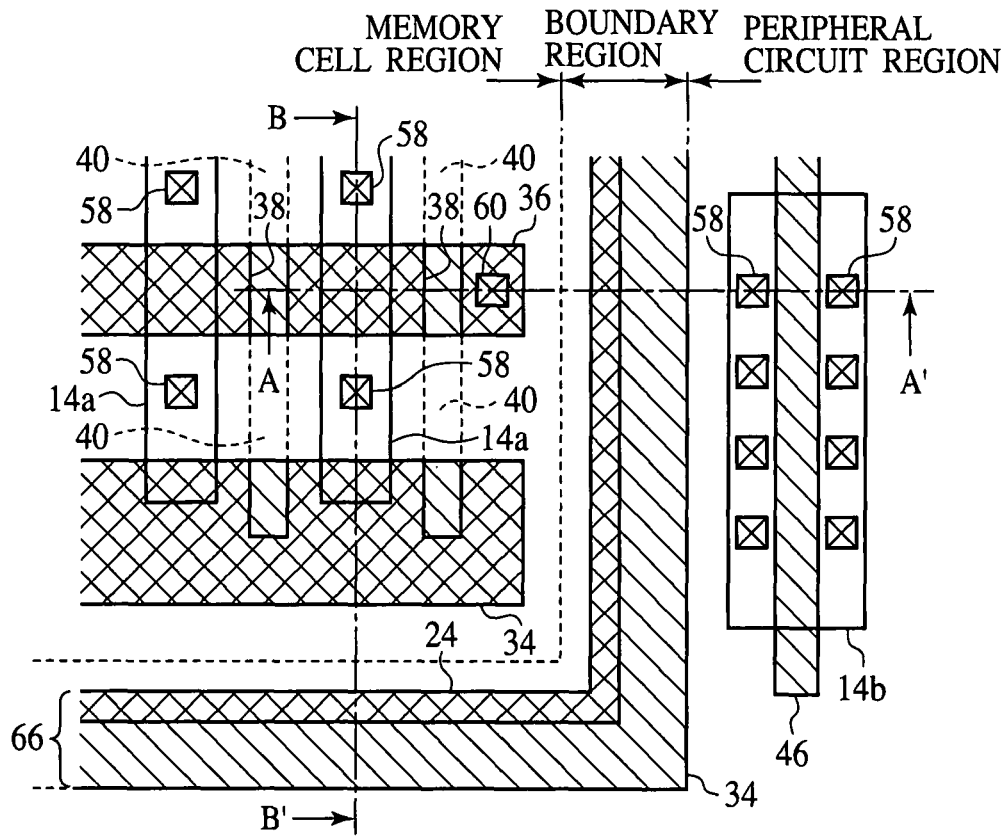
FIGS. 23A and 23B are views showing the configuration of the photoresist film in the peripheral part of the memory cell region in the method of manufacturing the semiconductor device according to one embodiment of the present invention.
Figure 23B:
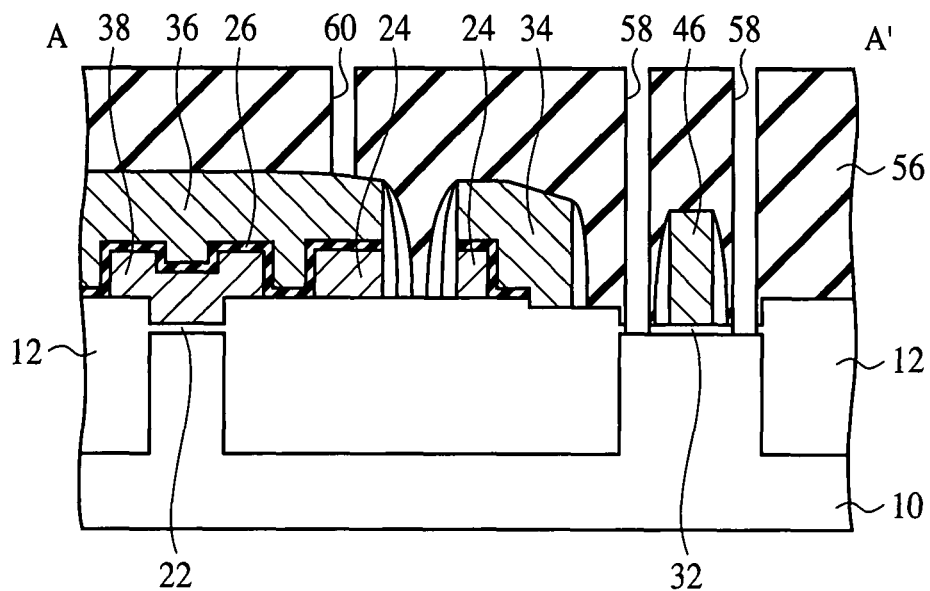

On the other hand, when the contact hole 60 is formed reaching down to the word line 36 extended over the polycrystalline silicon film 24 as shown in FIGS. 23A and 23B, the contact holes 58, 60 are largely different in the depth, which will make the etching of the contact holes 58, 60 difficult. However, as evident in comparison with FIG. 12 and FIG. 23A, the contact hole 60 is formed down to the word line 36 extended over the polycrystalline silicon film 24, whereby the area of the contact portion can be decreased. The recess regions 40 can be further narrowed, whereby thinning of the photoresist film 54 can be further suppressed.

It is preferable that the position for the contact hole 60 to be formed is selected suitably depending on the etching conditions and the degree of the photoresist film 64 being thinned.

What is claimed is:

1. A method of manufacturing a semiconductor device including on a semiconductor substrate a first region where a first transistor including a first gate electrode of a stacked structure having a floating gate and a control gate is formed, a second region where a second transistor including a second gate electrode of a single-layer structure is formed, and a frame-shaped third region positioned in a boundary part between the first region and the second region, comprising:
   forming a first conductive film over the first region, the second region and the third region of the semiconductor substrate;
   patterning the first conductive film to remove the first conductive film in the second region and to form in the first region and the third region a pattern of the first conductive film having a frame-shaped pattern, the frame-shaped pattern being formed along an edge of the first region, an outer edge of the first conductive film being positioned in the third region;
   forming a first insulating film covering the first conductive film in the first region of the semiconductor substrate;
   forming a second conductive film over the first region, the second region and the third region of the semiconductor substrate;
   patterning the second conductive film to form in the first region the control gate formed of the second conductive film and extended to a region where the frame-shaped pattern is formed, while leaving the second conductive film so that the second conductive film covers the second region and is positioned in the third region having an inner edge positioned inner of said outer edge;
   patterning the first insulating film and the first conductive film in the first region to form the floating gate of the first conductive film;
   after forming the control gate and the floating gate, forming a photoresist film having a pattern of the second gate electrode over the semiconductor substrate; and
   patterning the second conductive film in the second region with the photoresist film as a mask to form the second gate electrode of the second conductive film in the second region.

2. The method of manufacturing a semiconductor device according to claim 1,
   further comprising:
      forming a second insulating film over the first transistor; and
      forming a contact hole in the second insulating film reaching down to the control gate,
   in which, in forming the contact hole, the contact hole is formed in a region where the first conductive film is not formed below the control gate.

3. The method of manufacturing a semiconductor device according to claim 1,
   further comprising:
      forming a second insulating film over the first transistor; and
      forming a contact hole in the second insulating film reaching down to the control gate,
   in which, in forming the contact hole, the contact hole is formed in a region where the first conductive film is formed below the control gate.

4. The method of manufacturing a semiconductor device according to claim 1, further comprising, before forming the first conductive film,
   forming a device isolation insulating film for defining device regions in the first region and the second region.

* * * * *